(12) United States Patent
Hu et al.

(10) Patent No.: US 10,734,976 B2
(45) Date of Patent: *Aug. 4, 2020

(54) DRIVING CIRCUIT FOR POWER SWITCH

(71) Applicant: Delta Electronics, Inc., Taoyuan (TW)

(72) Inventors: Peiqing Hu, Taoyuan (TW); Jianhong Zeng, Taoyuan (TW); Haoyi Ye, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/548,781

(22) Filed: Aug. 22, 2019

(65) Prior Publication Data

US 2019/0379362 A1 Dec. 12, 2019

Related U.S. Application Data

(63) Continuation of application No. 15/332,623, filed on Oct. 24, 2016, now Pat. No. 10,483,949.

(30) Foreign Application Priority Data

Dec. 1, 2015 (CN) .......................... 2015 1 0867765

(51) Int. Cl.
*H03K 3/00* (2006.01)
*H03K 3/012* (2006.01)
(Continued)

(52) U.S. Cl.
CPC .............. *H03K 3/012* (2013.01); *H02M 1/08* (2013.01); *H03K 17/04123* (2013.01);
(Continued)

(58) Field of Classification Search
CPC ................. H03K 3/012; H03K 17/163; H03K 17/04123; H03K 17/687; H02M 1/08;
(Continued)

(56) References Cited

U.S. PATENT DOCUMENTS 7,852,125 B2 * 12/2010 Lopez ..................... H02M 1/08
327/108
8,203,380 B2 * 6/2012 Hashimoto ......... H01L 27/0629
327/109
(Continued)

FOREIGN PATENT DOCUMENTS

CN 1402206 A 3/2003
CN 102315757 A 1/2012
(Continued)

*Primary Examiner* — Ryan Jager
(74) *Attorney, Agent, or Firm* — Kirton McConkie; Evan R. Witt

(57) ABSTRACT

A driving circuit for driving a power switch. The driving circuit and the power switch are collaboratively defined as an equivalent circuit. The equivalent circuit includes a first equivalent capacitor corresponding to an input capacitor of the power switch, an equivalent inductor, and a second equivalent capacitor corresponding to a parasitic parameter of at least one driving switch. In the charging procedure or the discharging of the first equivalent capacitor, a change amount of charges in the first equivalent capacitor while a voltage of the input capacitor is changed from a voltage corresponding to no inductor current to a set voltage is larger than or equal to a change amount of charges in the second equivalent capacitor while the voltage of the input capacitor is changed from the voltage corresponding to no inductor current to a steady voltage.

36 Claims, 35 Drawing Sheets

(51) Int. Cl.
  *H02M 1/08* (2006.01)
  *H03K 17/0412* (2006.01)
  *H03K 17/16* (2006.01)
  *H03K 17/687* (2006.01)
  *H02M 3/158* (2006.01)
  *H02M 1/34* (2007.01)

(52) U.S. Cl.
  CPC ......... *H03K 17/163* (2013.01); *H03K 17/687* (2013.01); *H02M 3/158* (2013.01); *H02M 3/1582* (2013.01); *H02M 2001/346* (2013.01); *Y02B 70/1425* (2013.01); *Y02B 70/1491* (2013.01)

(58) Field of Classification Search
  CPC ........... H02M 2001/346; H02M 3/158; H02M 3/1582; Y02B 70/1491
  USPC ................................................. 327/108–112
  See application file for complete search history.

(56) References Cited

U.S. PATENT DOCUMENTS

| | | | | |
|---|---|---|---|---|
| 8,698,463 | B2* | 4/2014 | Dwarakanath | H02M 3/1582 323/259 |
| 8,912,839 | B2* | 12/2014 | Honea | H03K 17/6871 327/424 |
| 9,548,714 | B2* | 1/2017 | Abou-Alfotouh | H02M 3/1582 |
| 2006/0044856 | A1* | 3/2006 | Bird | H02M 3/1588 363/131 |
| 2008/0079405 | A1* | 4/2008 | Shimizu | H02M 1/4208 323/282 |
| 2008/0084197 | A1* | 4/2008 | Williams | H02M 1/38 323/282 |
| 2009/0033377 | A1* | 2/2009 | Hashimoto | H02M 3/07 327/112 |
| 2012/0091986 | A1* | 4/2012 | Takemae | H01L 21/8252 323/311 |
| 2012/0176105 | A1* | 7/2012 | Chang | H02M 3/1584 323/237 |
| 2016/0124478 | A1* | 5/2016 | Beeston | G06F 1/28 713/300 |
| 2017/0019095 | A1* | 1/2017 | Leong | H03K 17/167 |
| 2017/0331371 | A1* | 11/2017 | Parto | H02M 3/156 |
| 2018/0013422 | A1* | 1/2018 | Leong | H03K 17/6871 |

FOREIGN PATENT DOCUMENTS

| | | |
|---|---|---|
| CN | 102315757 B | 7/2014 |
| JP | 2011188383 A | 9/2011 |
| KR | 20010103509 A | 11/2001 |
| TW | 345349 U | 11/1998 |
| TW | 201421877 A | 6/2014 |

* cited by examiner

DRIVING CIRCUIT FOR POWER SWITCH

CROSS-REFERENCE TO RELATED APPLICATION

This application is a Continuation Application of U.S. patent application Ser. No. 15/332,623 filed on Oct. 24, 2016 and entitled "DRIVING CIRCUIT FOR POWER SWITCH", which claims priority to China patent application No. 201510867765.X filed on Dec. 1, 2015 and entitled "DRIVING CIRCUIT FOR POWER SWITCH", the entirety of which is hereby incorporated by reference.

FIELD OF THE INVENTION

The present invention relates to a driving circuit, and more particularly to a driving circuit for a power switch.

BACKGROUND OF THE INVENTION

A switching power supply is widely used in an electronic device. For reducing the size and weight of the switching power supply, the frequency of the switching power supply is gradually increased. Consequently, the volumes of the passive components (e.g., inductors or capacitors) of the switching power supply are reduced. FIG. 1 is a plot illustrating the relationship between the driving loss and the switching frequency of a switching power supply. The driving loss of the switch element of the switching power supply is positively correlated with the switching frequency. As the switching frequency of the switching power supply is gradually increased, the driving loss gradually increases. In views of power-saving efficacy, the switching power supply of the electronic device should have enhanced efficiency even if the volume of the switching power supply is reduced. Consequently, it is important to reduce the driving loss of the switch element.

FIG. 2 is a schematic circuit diagram illustrating a driving circuit for a switch element according to the prior art. As shown in FIG. 2, the driving circuit comprises driving switches S11 and S12 and a resistor R. The capacitor Ciss is an input capacitor of a power switch (not shown). When the driving switch S11 is turned on, the input capacitor of the power switch is charged. When the driving switch S12 is turned on, the input capacitor of the power switch is discharged. The resistor R is a parasitic resistor of the charge/discharge loop.

FIG. 3 is a schematic circuit diagram illustrating a conventional metal oxide semiconductor field effect transistor (MOSFET). The voltage difference between the gate terminal G and the source terminal S of the MOSFET is Vgs. The voltage difference between the gate terminal G and the source terminal D of the MOSFET is Vgd. The capacitance of the input capacitor Ciss is expressed as: Ciss=Cgs+Cgd×(Vgd/Vgs). In the above formula, Cgs is the capacitance between the gate terminal and the source terminal S, and Cgd is the capacitance between the gate terminal G and the drain terminal D. Generally, the magnitude of the input capacitor Ciss corresponding to the voltage difference Vgs is provided from the specifications of the MOSFET.

The operations of the driving circuit will be described as follows. For charging the input capacitor Ciss, the driving switch S11 is turned on and the driving switch S12 is turned off. Consequently, the input capacitor Ciss is charged to a supply voltage Vcc through the driving switch S11 and the resistor R. The driving switch S11 is maintained in the on state and the driving switch S12 is maintained in the off state until the charging procedure of the input capacitor Ciss is completed. In the charging procedure, the energy consumed by the resistor R is equal to $0.5 \times Ciss \times Vcc^2$. For discharging the input capacitor Ciss, the driving switch S11 is turned off and the driving switch S12 is turned on. Consequently, the input capacitor Ciss is discharged to 0V through the driving switch S12 and the resistor R. The driving switch S11 is maintained in the off state and the driving switch S12 is maintained in the on state until the discharging procedure of the input capacitor Ciss is completed. In the discharging procedure, the energy consumed by the resistor R is also equal to $0.5 \times Ciss \times Vcc^2$.

For reducing the total consumed energy of the resistor R in the charging/discharging procedures, another driving circuit for the power switch is disclosed. FIG. 4 is a schematic circuit diagram illustrating another driving circuit for a switch element according to the prior art. FIG. 5 is schematic timing waveform diagram illustrating associated signals of the components of the driving circuit of FIG. 4. In this driving circuit, a constant current source is used for charging or discharging the input capacitor Ciss. For charging the input capacitor Ciss, the driving switches S21 and S23 are turned on in the time interval between t0 and t1. Consequently, the current flowing through the inductor L reaches a nearly-constant value I1. Then, the driving switches S21 and S23 are turned off. Consequently, in the time interval between t1 and t2, the inductor L provides the nearly-constant value I1 to charge the input voltage Ciss to the supply voltage Vcc. When the input voltage Ciss is charged to the supply voltage Vcc (i.e., at the time point t2), the driving switches S22 and S24 are turned on. Meanwhile, the charging procedure of the input voltage Ciss is completed. Since the current flowing through the resistor R is nearly constant in the charging procedure, the energy consumed by the resistor R is lower. For discharging the input capacitor Ciss, the driving switches S22 and S25 are turned on in the time interval between t2 and t3. Consequently, the current flowing through the inductor L reaches a nearly-constant value I2. Then, the driving switches S22 and S24 are turned off. Consequently, in the time interval between t3 and t4, the inductor L provides the nearly-constant value I2 to discharge the input voltage Ciss to 0V. When the input voltage Ciss is discharged to 0V (i.e., at the time point t4), the driving switches S21 and S23 are turned on. Meanwhile, the discharging procedure of the input voltage Ciss is completed. Since the current flowing through the resistor R is nearly constant in the discharging procedure, the energy consumed by the resistor R is lower.

However, since the inductor L has to provide the nearly-constant current in the charging procedure and the discharging procedure of the input capacitor Ciss of the power switch, lager inductance of the inductor L is required. That is, the inductor L has bulky volume. Moreover, since the current flows through the inductor L whenever the input capacitor Ciss is charged or discharged, the energy loss of the inductor L is larger.

Therefore, there is a need of providing an improved driving circuit for a power switch in order to overcome the above drawbacks.

SUMMARY OF THE INVENTION

The present invention provides a driving circuit for a power switch. The inductor of the driving circuit does not need to provide the constant current. Under this circumstance, smaller inductance of the inductor is required, and thus the volume of the inductor is reduced. Moreover, the energy loss of the driving circuit is reduced when compared with the conventional driving circuit.

In accordance with an aspect of the present invention, there is provided a driving circuit for driving a power switch. The driving circuit includes an inductor and at least one driving circuit. The at least one driving circuit is electrically connected with the inductor. The driving circuit and the power switch are collaboratively defined as an equivalent circuit. The equivalent circuit includes a first equivalent capacitor, an equivalent inductor and a second equivalent capacitor. The first equivalent capacitor corresponds to an input capacitor of the power switch. The equivalent inductor comprises the inductor. The equivalent inductor is connected with the first equivalent capacitor in series. The second equivalent capacitor corresponds to a parasitic parameter of at least one driving switch. The first equivalent capacitor, the equivalent inductor and the equivalent resistor are serially connected with each other to define a charge/discharge loop. Moreover, a charging procedure or a discharging procedure of the first equivalent capacitor is performed through the charge/discharge loop. While a voltage of the input capacitor is changed from a voltage corresponding to no inductor current to a first set voltage in the charging procedure of the first equivalent capacitor, or while the voltage of the input capacitor is changed from the voltage corresponding to no inductor current to a second set voltage in the discharging procedure of the first equivalent capacitor, the first equivalent capacitor has a first change amount of charges. While the voltage of the input capacitor is changed from the voltage corresponding to no inductor current to a steady voltage, the second equivalent capacitor has a second change amount of charges. The first change amount of charges is larger than or equal to the second change amount of charges. The first set voltage is higher than a maximum threshold of a gate terminal of the power switch, and the second set voltage is lower than a minimum threshold of the gate terminal of the power switch.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a driving circuit for driving a power switch. The driving circuit comprises an inductor, at least one driving switch and a resistor. The inductor, the driving switch and the resistor are electrically connected with each other. Moreover, the driving switch comprises a parasitic parameter.

Figure 1:
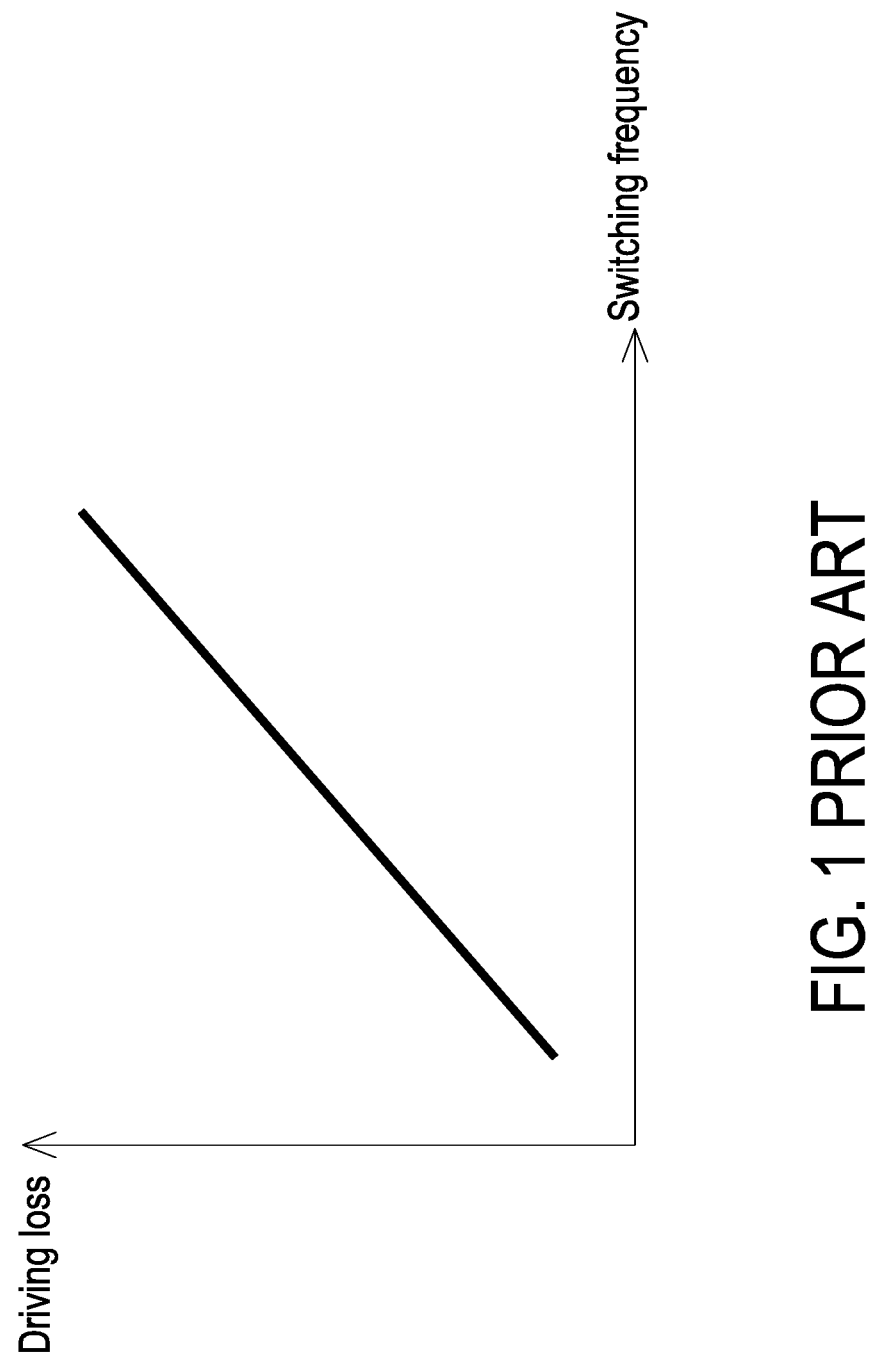
FIG. 1 is a plot illustrating the relationship between the driving loss and the switching frequency of a switching power supply.
Figure 2:
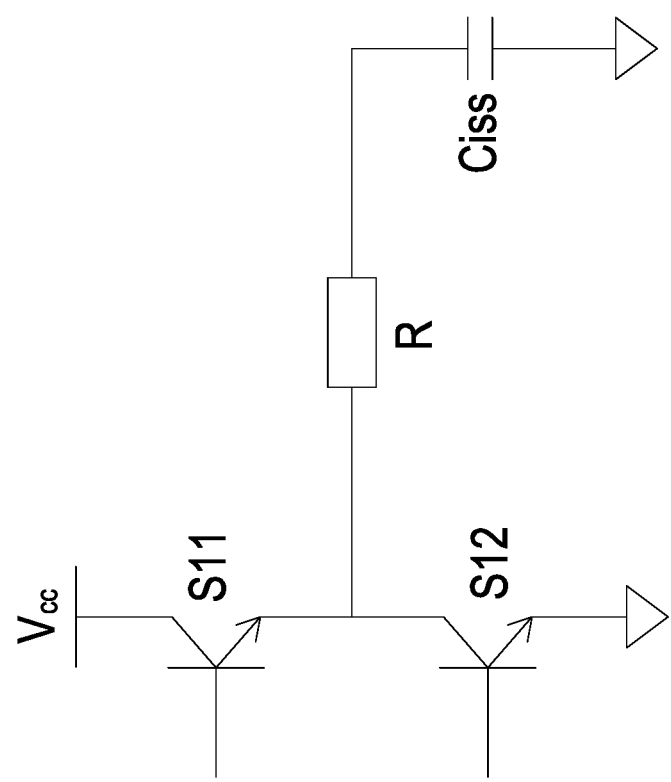
FIG. 2 is a schematic circuit diagram illustrating a driving circuit for a switch element according to the prior art.
Figure 3:
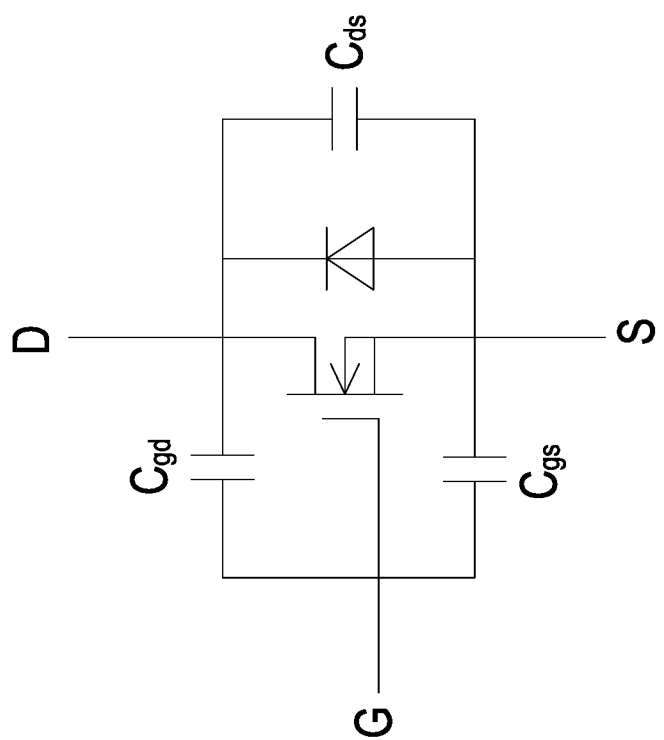
FIG. 3 is a schematic circuit diagram illustrating a conventional metal oxide semiconductor field effect transistor.
Figure 4:
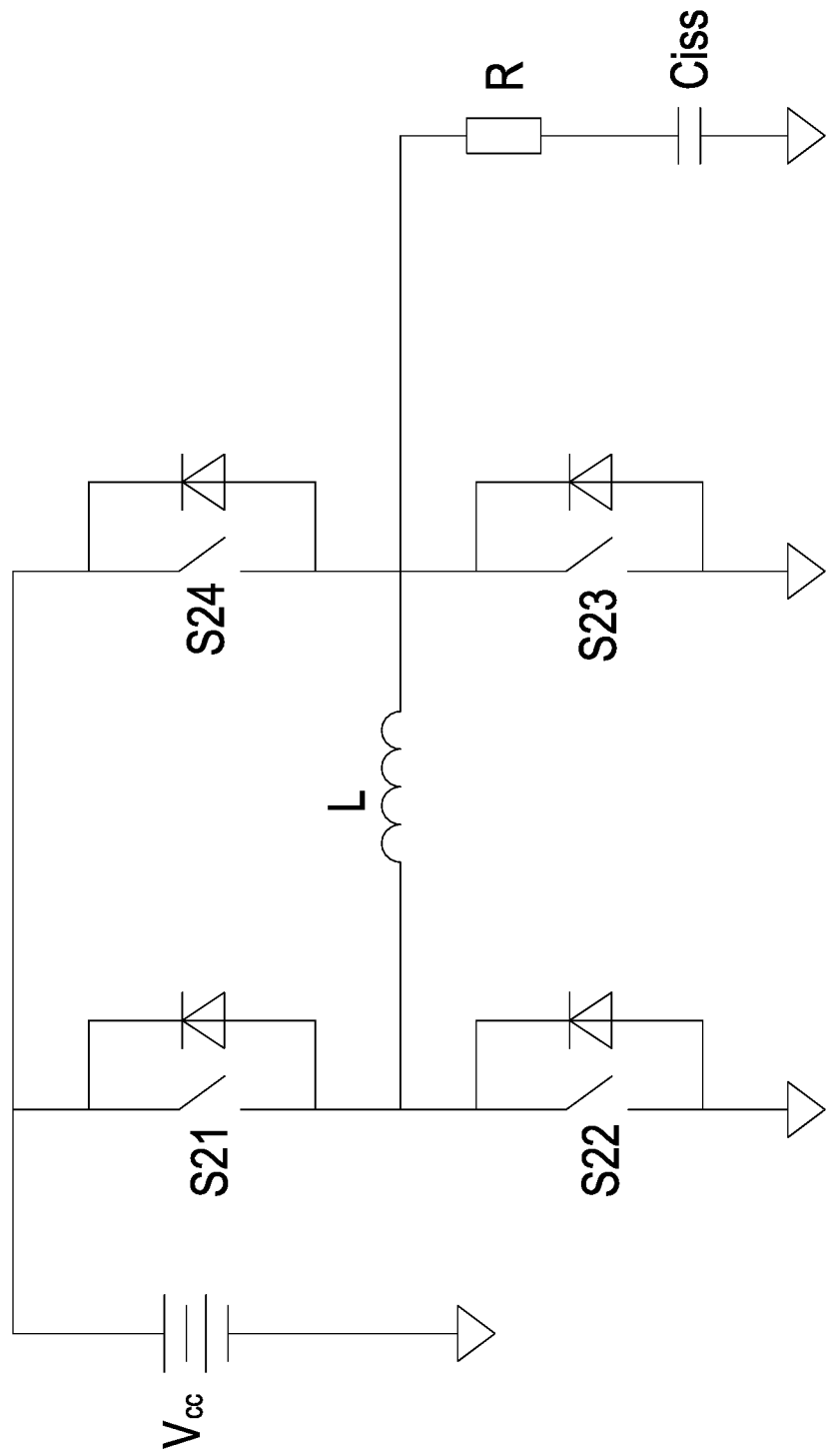
FIG. 4 is a schematic circuit diagram illustrating another driving circuit for a switch element according to the prior art.
Figure 5:
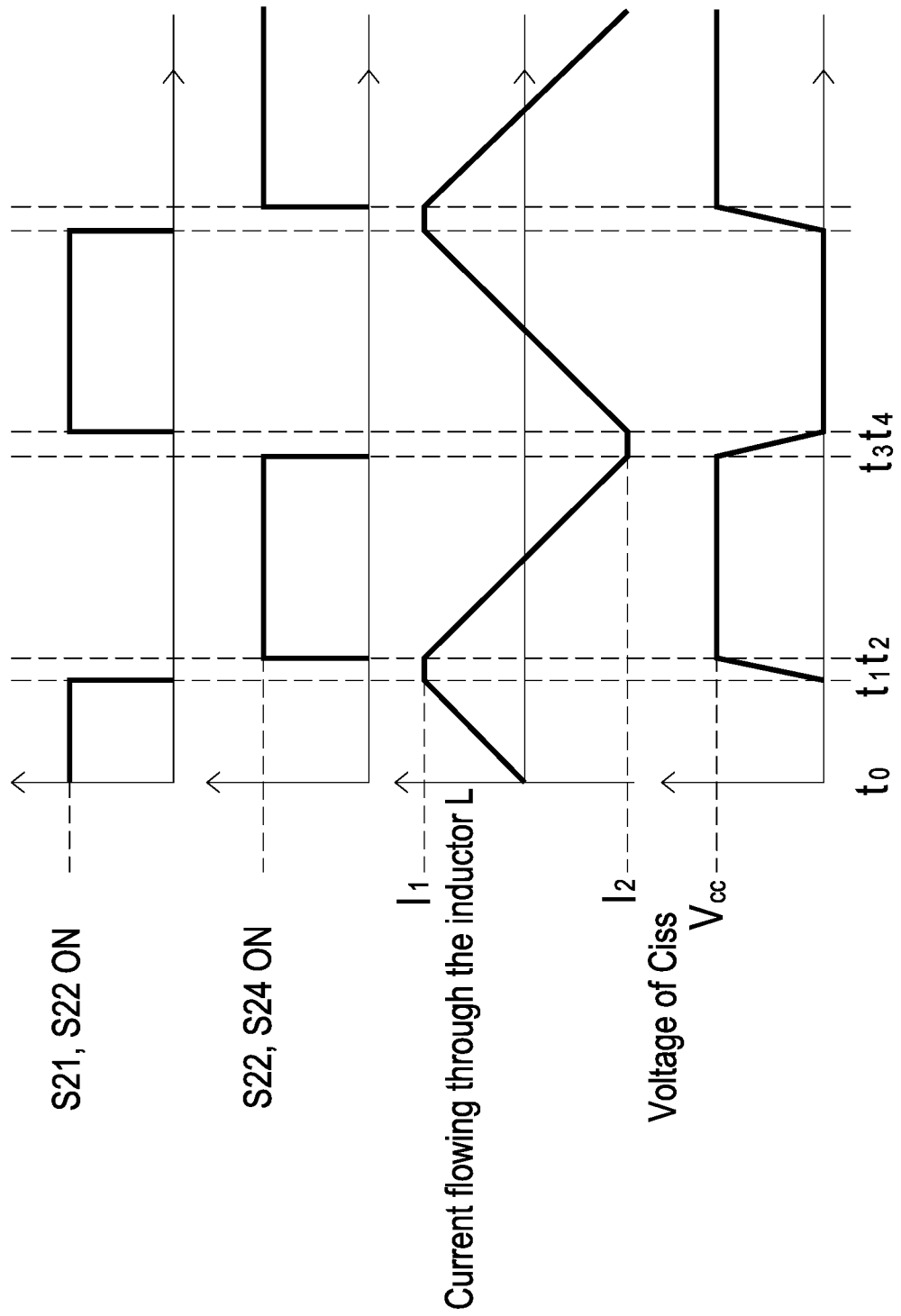
FIG. 5 is schematic timing waveform diagram illustrating associated signals of the components of the driving circuit of FIG. 4.
Figure 6:
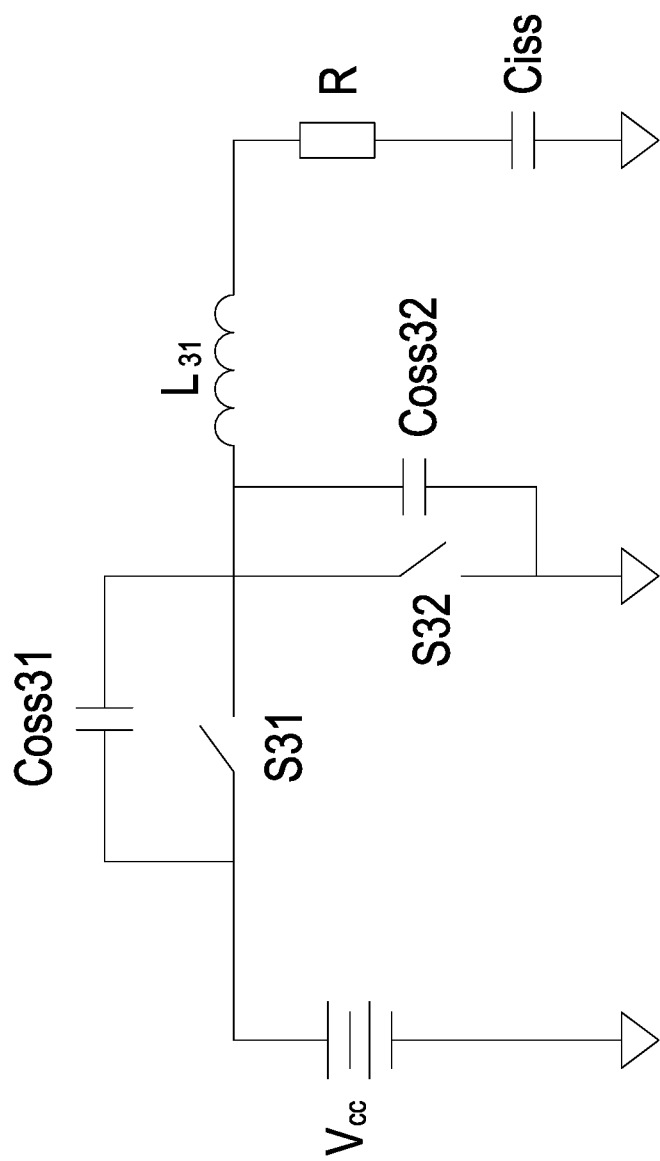
FIG. 6 is a schematic circuit diagram illustrating a driving circuit for a power switch according to a first embodiment of the present invention.

FIG. 6 is a schematic circuit diagram illustrating a driving circuit for a power switch according to a first embodiment of the present invention. As shown in FIG. 6, the driving circuit 1 comprises an inductor L31, a first driving switch S31, a second driving switch S32 and a resistor R. The capacitor Ciss is an input capacitor of the power switch (not shown). The first terminal of the first driving switch S31 is electrically connected with an input power source. The second terminal of the first driving switch S31 is electrically connected with the first terminal of the second driving switch S32 and the first terminal of the inductor L31. The second terminal of the second driving switch S32 is connected with a ground terminal. The second terminal of the inductor L31 is electrically connected with the first terminal of the resistor R. The second terminal of the resistor R is electrically connected with the input capacitor Ciss. Moreover, the parasitic parameter of the first driving switch S31 is a first parasitic capacitor Coss31, and the parasitic parameter of the second driving switch S32 is a second parasitic capacitor Coss32.

The operations of charging and discharging the input capacitor Ciss will be described as follows. In this embodiment, the first driving switch S31 and the second driving switch S32 are selectively turned on or turned off to control the charging and discharging procedures of the input capacitor Ciss.

Figure 7:
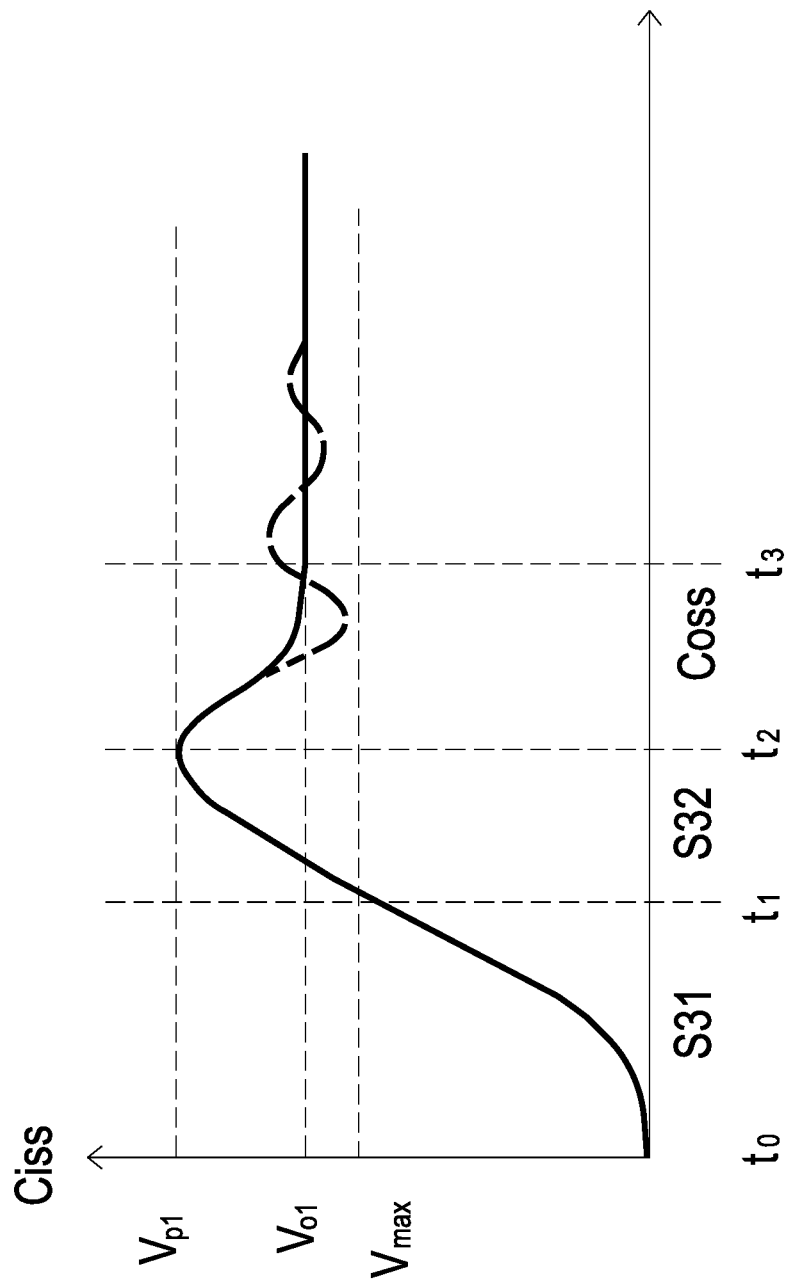
FIG. 7 is a schematic timing waveform diagram illustrating associated voltage signals of the driving circuit of FIG. 6 in the charging procedure of the input capacitor.

FIG. 7 is a schematic timing waveform diagram illustrating associated voltage signals of the driving circuit of FIG. 6 in the charging procedure of the input capacitor. Firstly, the first driving switch S31 is turned on in the time interval between t0 and t1. Consequently, the electric energy of the supply voltage Vcc of the input power source charges the inductor L31 and the input capacitor Ciss through the first driving switch S31. At the time point t1, the first driving switch S31 is turned off and the second driving switch S32 is turned on. Consequently, the input capacitor Ciss is continuously charged by the current of the inductor L31 until the current of the inductor L31 is zero (i.e., at the time point t2). Meanwhile, the input capacitor Ciss is charged to the voltage Vp1. The voltage Vp1 must be lower than the supply voltage Vcc. Moreover, at the time point t2, the first parasitic capacitor Coss31 is charged to the supply voltage Vcc, and the second parasitic capacitor Coss32 is 0V. Consequently, in the time interval between t2 and t3, the first parasitic capacitor Coss31 and the second parasitic capacitor Coss32 resonate with the input capacitor Ciss through the inductor L31. Due to the resonant oscillation, the voltage of the input capacitor Ciss gradually fluctuates from Vp1 to a first steady voltage $Vo_1$, the voltage of the second parasitic capacitor Coss32 gradually fluctuates from 0V to the first steady voltage $Vo_1$, and the voltage of the first parasitic capacitor Coss31 gradually fluctuates from Vcc to the voltage (Vcc−$Vo_1$). The input capacitor Ciss is serially connected with the first parasitic capacitor Coss31 of the first driving switch S31 and the second parasitic capacitor Coss32 of the second driving switch S32. Consequently, in the time interval between t2 and t3, the amount of charges discharged from the input capacitor Ciss (i.e., from Vp1 to $Vo_1$) is Q1. Moreover, Q1 is equal to the change amount of charges in the first parasitic capacitor Coss31 while the voltage is changed from Vcc to (Vcc−$Vo_1$) plus the change amount of charges in the second parasitic capacitor Coss32 while the voltage is changed from 0V to $Vo_1$. For assuring that the on-resistance or the voltage drop of the on-state power switch is very low, the first steady voltage $Vo_1$ must be higher than a first set voltage VH, wherein the first set voltage VH is higher than the maximum threshold Vmax of the gate terminal of the power switch according to the specifications of the power switch. Consequently, in the time interval between t2 and t3, the change amount of charges of the input capacitor Ciss from Vp1 to VH is Q2. Especially, Q2 is higher than Q1. That is, in the charging procedure of the input capacitor Ciss, the relationships between Q1, Q2, Coss31, Coss32, Ciss, Vp1, VH and $Vo_1$ satisfy the following formulae (1), (2) and (3):

$$Q1 = Coss31 \times Vo_1 + Coss32 \times Vo_1 \qquad (1)$$

$$Q2 = Ciss \times (Vp1 - VH) \qquad (2)$$

$$Q1 \le Q2 \qquad (3)$$

As mentioned above, the resonant oscillation occurs in the time interval between t2 and t3. If the resistance of the resistor R is higher, the oscillation circuit is in an overdamping condition. Under this circumstance, the voltage of the input capacitor Ciss does not fluctuate to the level under the first steady voltage $Vo_1$ (e.g., the solid line of FIG. 7). If the resistance of the resistor R is lower, the oscillation circuit is in an underdamping condition. Under this circumstance, the voltage of the input capacitor Ciss fluctuates up and down with respect to the first steady voltage $Vo_1$ and finally maintained at the first steady voltage $Vo_1$ (e.g., the dotted line of FIG. 7). For avoiding erroneously turning off the on-state power switch, the voltage of the input capacitor Ciss during the resonant oscillation must be higher than the maximum threshold Vmax of the gate terminal of the power switch according to the specifications of the power switch. Consequently, if the resistance of the resistor R is lower and many oscillation cycles are required, the first steady voltage $Vo_1$ must be higher than 0.5×(Vp1+Vmax). Preferably, the resistor R is selected such that the oscillation circuit is in a critical damping condition between the underdamping condition and the overdamping condition.

Figure 8:
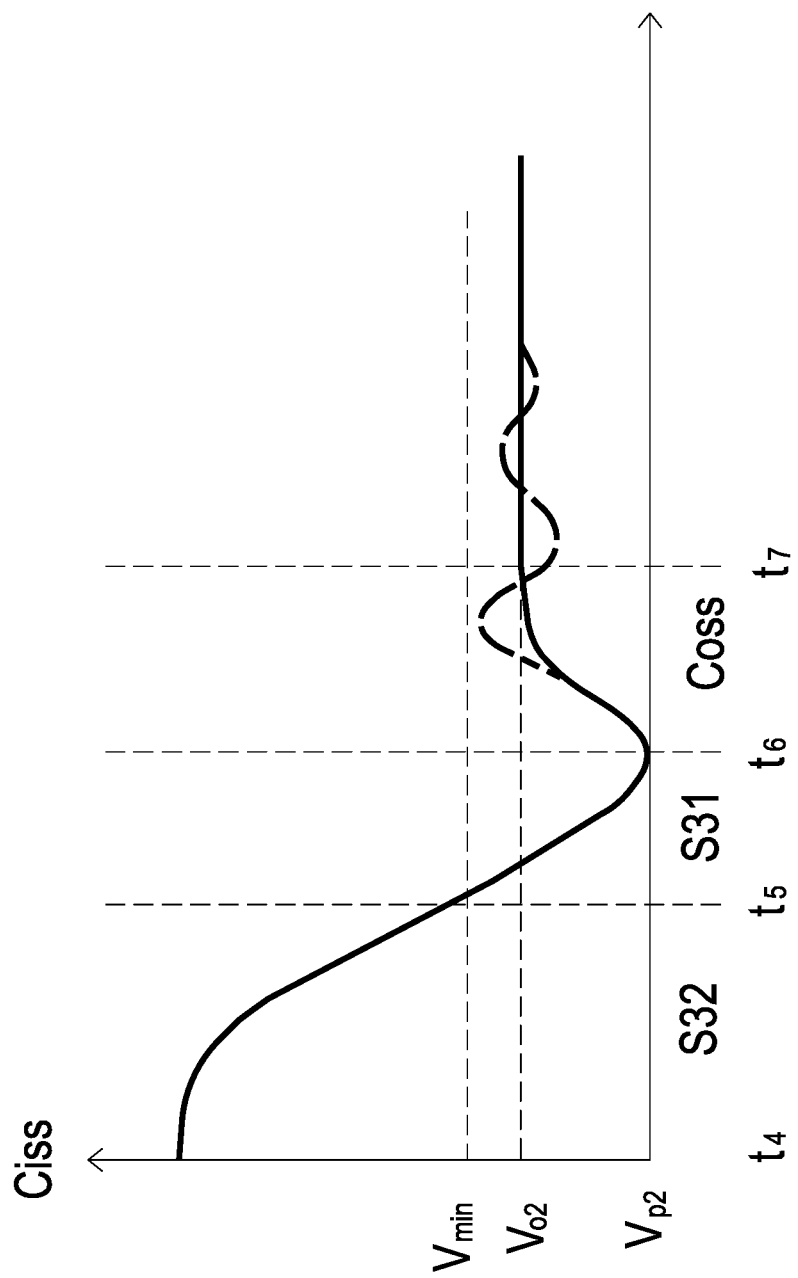
FIG. 8 is a schematic timing waveform diagram illustrating associated voltage signals of the driving circuit of FIG. 6 in the discharging procedure of the input capacitor.

FIG. 8 is a schematic timing waveform diagram illustrating associated voltage signals of the driving circuit of FIG. 6 in the discharging procedure of the input capacitor. Firstly, the second driving switch S32 is turned on in the time interval between t4 and t5. Consequently, the input capacitor Ciss discharges electricity, and the current flowing through the inductor L31 increases. At the time point t5 when the current of the inductor L31 reaches a predetermined value, the second driving switch S32 is turned off and the first driving switch S31 is turned on. Consequently, the input capacitor Ciss discharges electricity to the input power source through the inductor L31, and the current of the inductor L31 gradually decreases until the current of the inductor L31 is zero (i.e., at the time point t6). Meanwhile, the voltage of the input capacitor Ciss is reduced to the voltage Vp2. Moreover, at the time point t6, the first parasitic capacitor Coss31 is discharged to 0V, and the second parasitic capacitor Coss32 is charged to the supply voltage Vcc. Consequently, in the time interval between t6 and t7, the first parasitic capacitor Coss31 and the second parasitic capacitor Coss32 resonate with the input capacitor Ciss through the inductor L31. Due to the resonant oscillation, the voltage of the input capacitor Ciss gradually fluctuates from Vp2 to a second steady voltage $Vo_2$, the voltage of the second parasitic capacitor Coss32 gradually fluctuates to the second steady voltage $Vo_2$, and the voltage of the first parasitic capacitor Coss31 gradually fluctuates to the voltage (Vcc−$Vo_2$). The input capacitor Ciss is serially connected with the first parasitic capacitor Coss31 of the first driving switch S31 and the second parasitic capacitor Coss32 of the second driving switch S32. Consequently, in the time interval between t6 and t7, the amount of charges charged into the input capacitor Ciss (i.e., from Vp2 to $Vo_2$) is Q3. Moreover, Q3 is equal to the change amount of charges in the first parasitic capacitor Coss31 while the voltage is changed from 0V to (Vcc−$Vo_2$) plus the change amount of charges in the second parasitic capacitor Coss32 while the voltage is changed from Vcc to $Vo_2$. For assuring that the on-resistance of the on-state power switch is high or the leakage current is low, the second steady voltage $Vo_2$ must be lower than a second set voltage VL, wherein the second set voltage VL is lower than the minimum threshold Vmin of the gate terminal of the power switch according to the specifications of the power switch. Consequently, in the time interval between t6 and t7, the change amount of charges of the input capacitor Ciss from Vp2 to VL is equal to Q4. Especially, Q4 is higher than or equal to Q3. That is, in the discharging procedure of the input capacitor Ciss, the relationships between Q3, Q4, Coss31, Coss32, Ciss, Vp2, VL, Vcc and $Vo_2$ satisfy the following formulae (4), (5) and (6):

$$Q3=(Coss31+Coss32) \times (Vcc-Vo_2) \quad (4)$$

$$Q4=Ciss \times (Vp2-VL) \quad (5)$$

$$Q3 \leq Q4 \quad (6)$$

Preferably, the voltage Vp2 is 0V. If the on duration of the first driving switch S31 is too long, the input capacitor Ciss is inversely charged. Under this circumstance, the voltage Vp2 is lower than 0V, the oscillation extent of the voltage of the input capacitor Ciss is too large, and the energy loss increases. As mentioned above, the resonant oscillation occurs in the time interval between t6 and t7. If the resistance of the resistor R is higher, the oscillation circuit is in an overdamping condition. Under this circumstance, the voltage of the input capacitor Ciss does not fluctuate to the level over the second steady voltage $Vo_2$ (e.g., the solid line of FIG. 8). If the resistance of the resistor R is lower, the oscillation circuit is in an underdamping condition. Under this circumstance, the voltage of the input capacitor Ciss fluctuates up and down with respect to the second steady voltage $Vo_2$ and finally maintained at the second steady voltage $Vo_2$ (e.g., the dotted line of FIG. 8). For avoiding erroneously turning on the off-state power switch, the voltage of the input capacitor Ciss during the resonant oscillation must be lower than the minimum threshold Vmin. Consequently, if the resistance of the resistor R is lower and many oscillation cycles are required, the second steady voltage $Vo_2$ must be lower than 0.5×(Vp2+Vmin). Preferably, the resistor R is selected such that the oscillation circuit is in a critical damping condition between the underdamping condition and the overdamping condition.

As mentioned above, specified mathematic formulae are satisfied in the charging procedure and discharging procedure of the input capacitor Ciss of the driving circuit 1 and the inductor L31 of the driving circuit 1 may not need to provide the constant current. Under this circumstance, smaller inductance of the inductor L31 is required, and thus the volume of the inductor L31 is reduced. Moreover, the energy loss of the driving circuit 1 may be reduced when compared with the conventional driving circuit. In an embodiment, the inductor L31 is a physical inductor. In some other embodiments, the inductor L31 is a parasitic inductor that is formed in a wire between the driving switch and the input capacitor Ciss.

Figure 9:
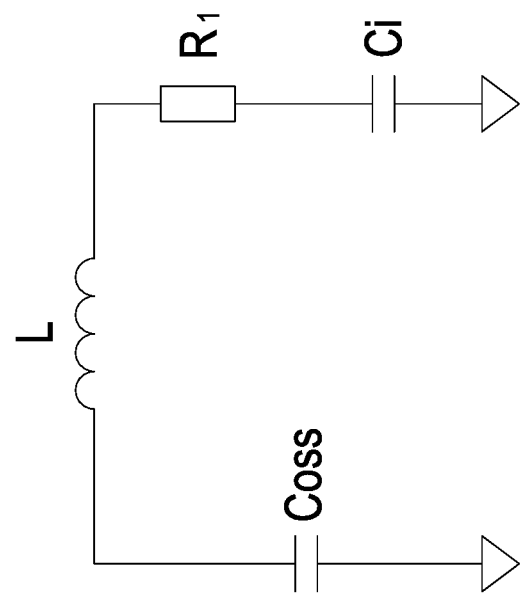
FIG. 9 is a schematic circuit diagram illustrating the equivalent circuit of the driving circuit of FIG. 6.

FIG. 9 is a schematic circuit diagram illustrating the equivalent circuit of the driving circuit of FIG. 6. As shown in FIG. 9, the equivalent circuit 2 comprises a first equivalent capacitor Ci, an equivalent inductor L, an equivalent resistor R1 and a second equivalent capacitor Coss. The first equivalent capacitor Ci is related to the input capacitor Ciss of the power switch. The equivalent inductor L comprises the inductor L31. The equivalent resistor R1 comprises the resistor R. Moreover, the equivalent resistor R1 is connected with the first equivalent capacitor Ci in series. The second equivalent capacitor Coss is related to the parasitic parameter of at least one driving switch. For example, the parasitic parameter of at least one driving switch comprises the first parasitic capacitor Coss31 of the first driving switch S31 and the second parasitic capacitor Coss32 of the second driving switch S32. That is, the second equivalent capacitor Coss is related to the first parasitic capacitor Coss31 of the first driving switch S31 and the second parasitic capacitor Coss32 of the second driving switch S32. Moreover, the first equivalent capacitor Ci, the equivalent inductor L, the equivalent resistor R1 and the second equivalent capacitor Coss32 are serially connected with each other to define a charge/discharge loop (i.e., the equivalent circuit 2). The charging operation or the discharging operation of the first equivalent capacitor Ci is performed by the charge/discharge loop.

Please refer to the equivalent circuit 2 and the charging procedure of the driving circuit 1. In the charging procedure of the first equivalent capacitor Ci, the voltage of the input capacitor Ciss is changed from the voltage Vp1 (i.e., no current flowing through the inductor or no inductor current) to the first set voltage VH. The change amount of charges in the first equivalent capacitor Ci is equal to Q2. While the voltage of the input capacitor Ciss is changed from Vp1 to $Vo_1$, the change amount of charges in the second equivalent capacitor Coss is Q1. Especially, Q2 is higher than or equal to Q1. Please refer to the equivalent circuit 2 and the discharging procedure of the driving circuit 1. In the discharging procedure of the first equivalent capacitor Ci, the voltage of the input capacitor Ciss is changed from the voltage Vp2 (i.e., no current flowing through the inductor or no inductor current) to the second set voltage VL. The change amount of charges in the first equivalent capacitor Ci is equal to Q4. While the voltage of the input capacitor Ciss is changed from Vp2 to Vo$_2$, the change amount of charges in the second equivalent capacitor Coss is Q3. Especially, Q4 is higher than or equal to Q3.

Figure 10:
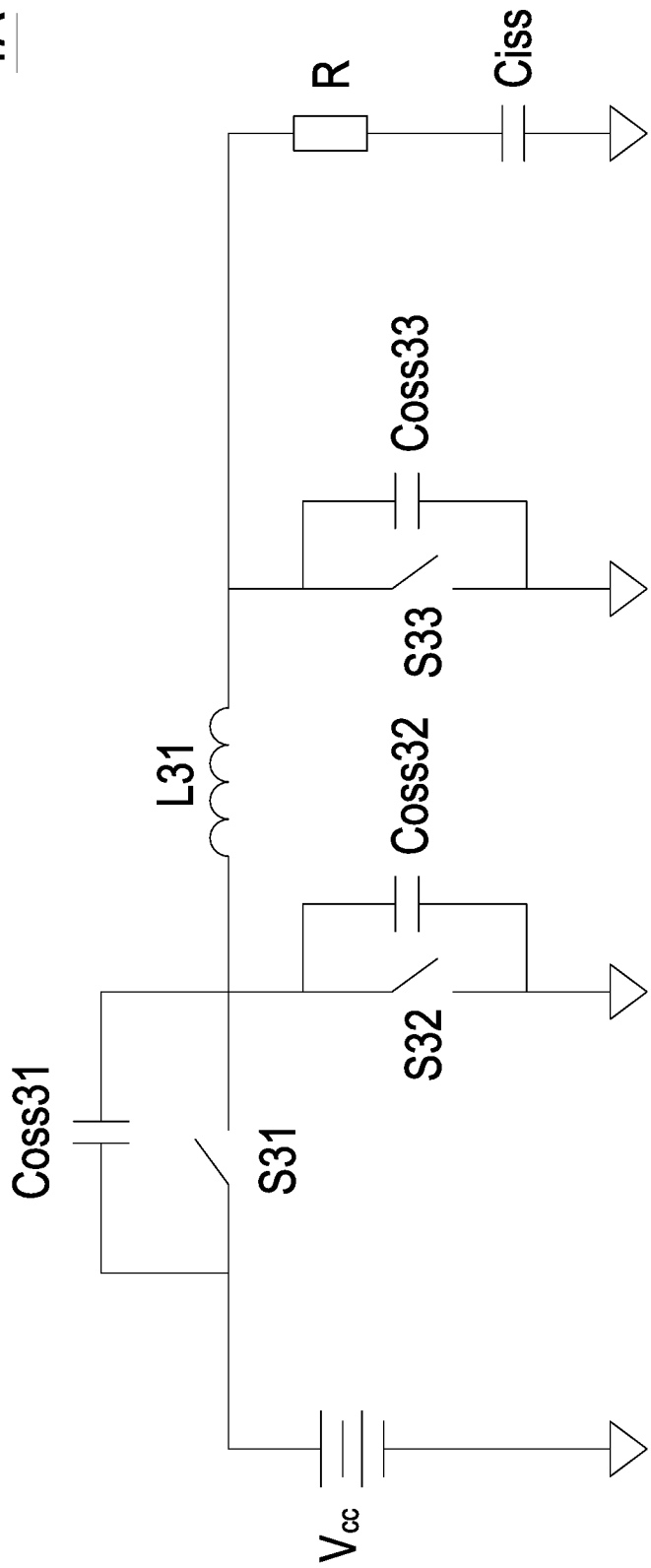
FIG. 10 is a schematic circuit diagram illustrating a driving circuit for a power switch according to a second embodiment of the present invention.

FIG. 10 is a schematic circuit diagram illustrating a driving circuit for a power switch according to a second embodiment of the present invention. Component parts and elements corresponding to those of the first embodiment are designated by identical numeral references, and detailed descriptions thereof are omitted. In comparison with the driving circuit 1 of FIG. 6, the driving circuit 1A of the present invention further comprises a third driving switch S33. The third driving switch S33 has a third parasitic capacitor Coss33. The first terminal of the third driving switch S33 is electrically connected with the second terminal of the inductor L31 and the first terminal of the resistor R. The second terminal of the third driving switch S33 is electrically connected with a ground terminal. The driving circuit 1A is substantially equivalent to the equivalent circuit 2 of FIG. 9. However, the first equivalent capacitor Ci of this embodiment is related to the input capacitor Ciss of the power switch and the third parasitic capacitor Coss33 of the third driving switch S33.

Figure 11:
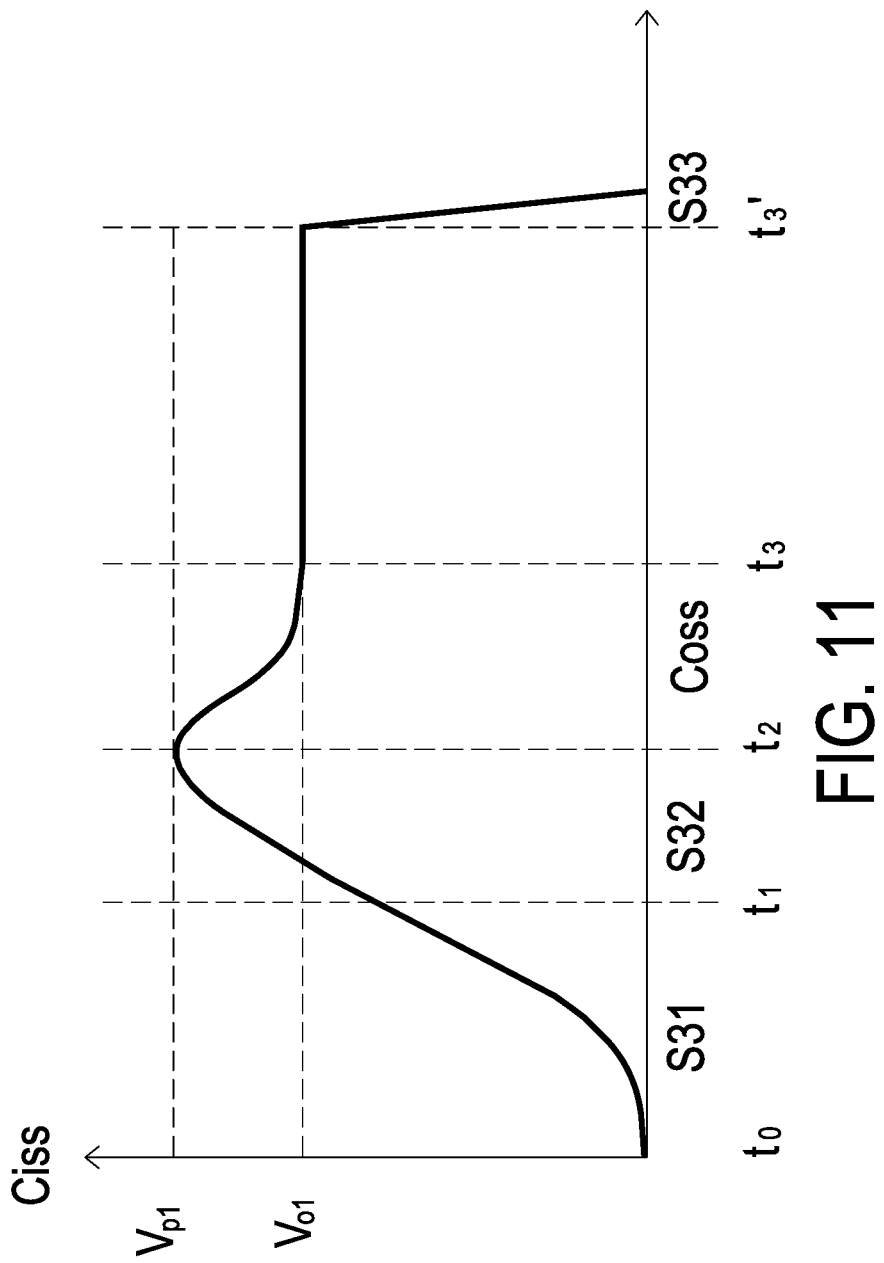
FIG. 11 is a schematic timing waveform diagram illustrating associated voltage signals of the driving circuit of FIG. 10 in the charging procedure of the input capacitor.

FIG. 11 is a schematic timing waveform diagram illustrating associated voltage signals of the driving circuit of FIG. 10 in the charging procedure of the input capacitor. Please refer to FIGS. 9, 10 and 11. In this embodiment, the first driving switch S31 and the second driving switch S32 are selectively turned on or turned off to control the charging procedure of the input capacitor Ciss. However, the discharging procedure of the input capacitor Ciss is controlled when the third driving switch S33 is turned on. That is, after the voltage of the input capacitor Ciss reaches the first steady voltage Vo$_1$ for a specified time period (e.g., at the time point t3'), the third driving switch S33 is turned on. Since the voltage of the input capacitor Ciss reduces to zero, the speed of turning off the power switch (not shown) is increased. As mentioned above, the first equivalent capacitor Ci is related to the input capacitor Ciss of the power switch and the third parasitic capacitor Coss33 of the third driving switch S33. Consequently, in the charging procedure of the first equivalent capacitor Ci, the relationships between Q1, Q2, Coss31, Coss32, Coss33, Ciss, Vp1, VH and Vo$_1$ satisfy the following formulae (7), (8) and (9):

$$Q1=(Coss31+Coss32)\times Vo_1 \quad (7)$$

$$Q2=(Ciss+Coss33)\times(Vp1-VH) \quad (8)$$

$$Q1\leq Q2 \quad (9)$$

Figure 12:
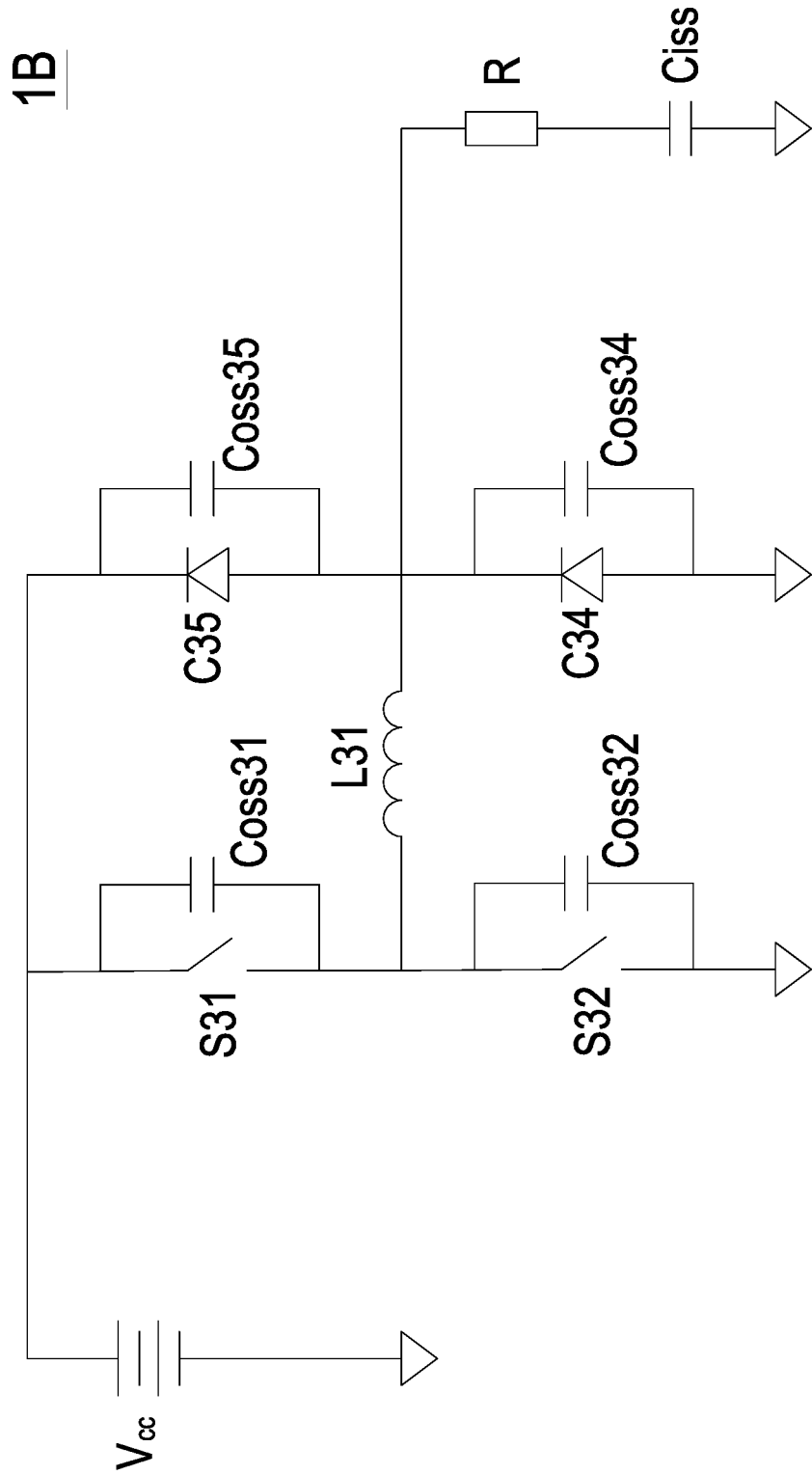
FIG. 12 is a schematic circuit diagram illustrating a driving circuit for a power switch according to a third embodiment of the present invention.

FIG. 12 is a schematic circuit diagram illustrating a driving circuit for a power switch according to a third embodiment of the present invention. Component parts and elements corresponding to those of the first embodiment are designated by identical numeral references, and detailed descriptions thereof are omitted. In comparison with the driving circuit 1 of FIG. 6, the driving circuit 1B of the present invention further comprises a first clamping circuit C35 and a second clamping circuit C34. The first clamping circuit C35 comprises a third parasitic capacitor Coss35. The second clamping circuit C34 comprises a fourth parasitic capacitor Coss34. The first terminal of the first clamping circuit C35 is connected with the first terminal of the first driving switch S31 and the input power source. The second terminal of the first clamping circuit C35 is connected with the second terminal of the inductor L31, the first terminal of the second clamping circuit C34 and the first terminal of the resistor R. The second terminal of the second clamping circuit C34 is connected with the ground terminal. The driving circuit 1B is substantially equivalent to the equivalent circuit 2 of FIG. 9. However, the first equivalent capacitor Ci of this embodiment is related to the input capacitor Ciss of the power switch, the third parasitic capacitor Coss35 of the first clamping circuit C35 and the fourth parasitic capacitor Coss34 of the second clamping circuit C34.

Figure 13:
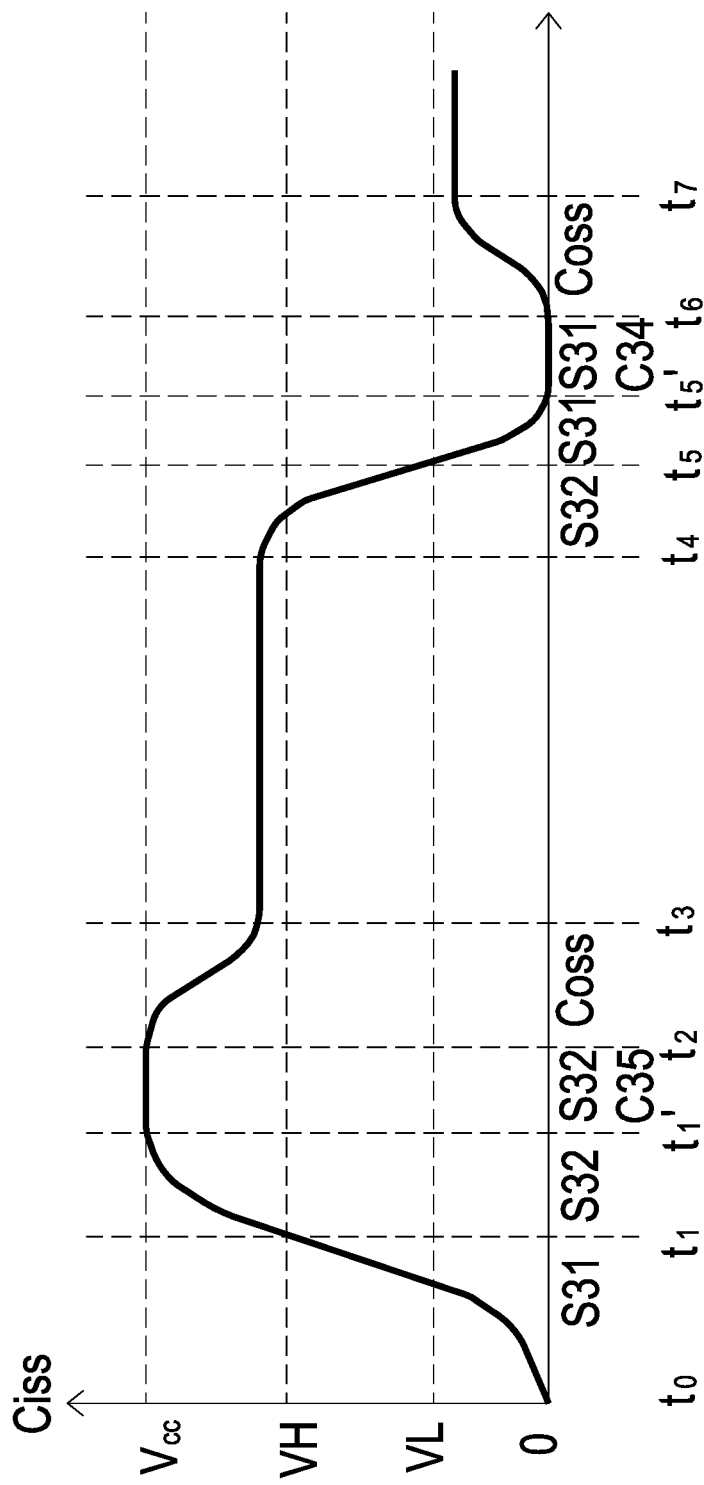
FIG. 13 is a schematic timing waveform diagram illustrating associated voltage signals of the driving circuit of FIG. 12 in the charging procedure and the discharging procedure of the input capacitor.

FIG. 13 is a schematic timing waveform diagram illustrating associated voltage signals of the driving circuit of FIG. 12 in the charging procedure and the discharging procedure of the input capacitor. Please refer to FIGS. 9, 12 and 13. The charging and discharging procedures of this embodiment are distinguished from those of the first embodiment. When the voltage of the input capacitor Ciss is charged to the voltage exceeding an over-voltage value in the time interval between t1' and t2, the voltage of the input capacitor Ciss is clamped to the over-voltage value by the first clamping circuit C35. In this embodiment, the over-voltage value is the supply voltage Vcc. In other words, the voltage Vp1 is very close to the supply voltage Vcc in the charging procedure of the input capacitor Ciss. When the voltage of the input capacitor Ciss is discharged to the voltage below an under-voltage value in the time interval between t5' and t6, the voltage of the input capacitor Ciss is clamped to the under-voltage value by the second clamping circuit C34. In this embodiment, the under-voltage value is the 0V. In other words, the voltage Vp2 is very close to 0V in the discharging procedure of the input capacitor Ciss.

Consequently, in the charging procedure of the input capacitor Ciss, it is not necessary to precisely control the voltage of the input capacitor Ciss in the on period of the second driving switch S32 (i.e., from t1 to t2). Moreover, in the discharging procedure of the input capacitor Ciss, it is not necessary to precisely control the voltage of the input capacitor Ciss in the on period of the first driving switch S31 (i.e., from t5 to t6). In this embodiment, the first equivalent capacitor Ci is related to the input capacitor Ciss of the power switch, the third parasitic capacitor Coss35 of the first clamping circuit C35 and the fourth parasitic capacitor Coss34 of the second clamping circuit C34. Consequently, in the charging procedure of the first equivalent capacitor Ci, the relationships between Q1, Q2, Coss31, Coss32, Coss34, Coss35, Ciss, Vp1, VH and Vo$_1$ satisfy the following formulae (10), (11) and (12):

$$Q1=(Coss31+Coss32)\times Vo_1 \quad (10)$$

$$Q2=(Ciss+Coss34+Coss35)\times(Vp1-VH) \quad (11)$$

$$Q1\leq Q2 \quad (12)$$

In the discharging procedure of the first equivalent capacitor Ci, the relationships between Q3, Q4, Coss31, Coss32, Coss34, Coss35, Ciss, Vp2, VL, Vcc and Vo$_2$ satisfy the following formulae (13), (14) and (15):

$$Q3=(Coss31+Coss32)\times(Vcc-Vo_2) \quad (13)$$

$$Q4=(Ciss+Coss34+Coss35)\times(Vp2-VL) \quad (14)$$

$$Q3 \leq Q4 \quad (15)$$

Figure 14:
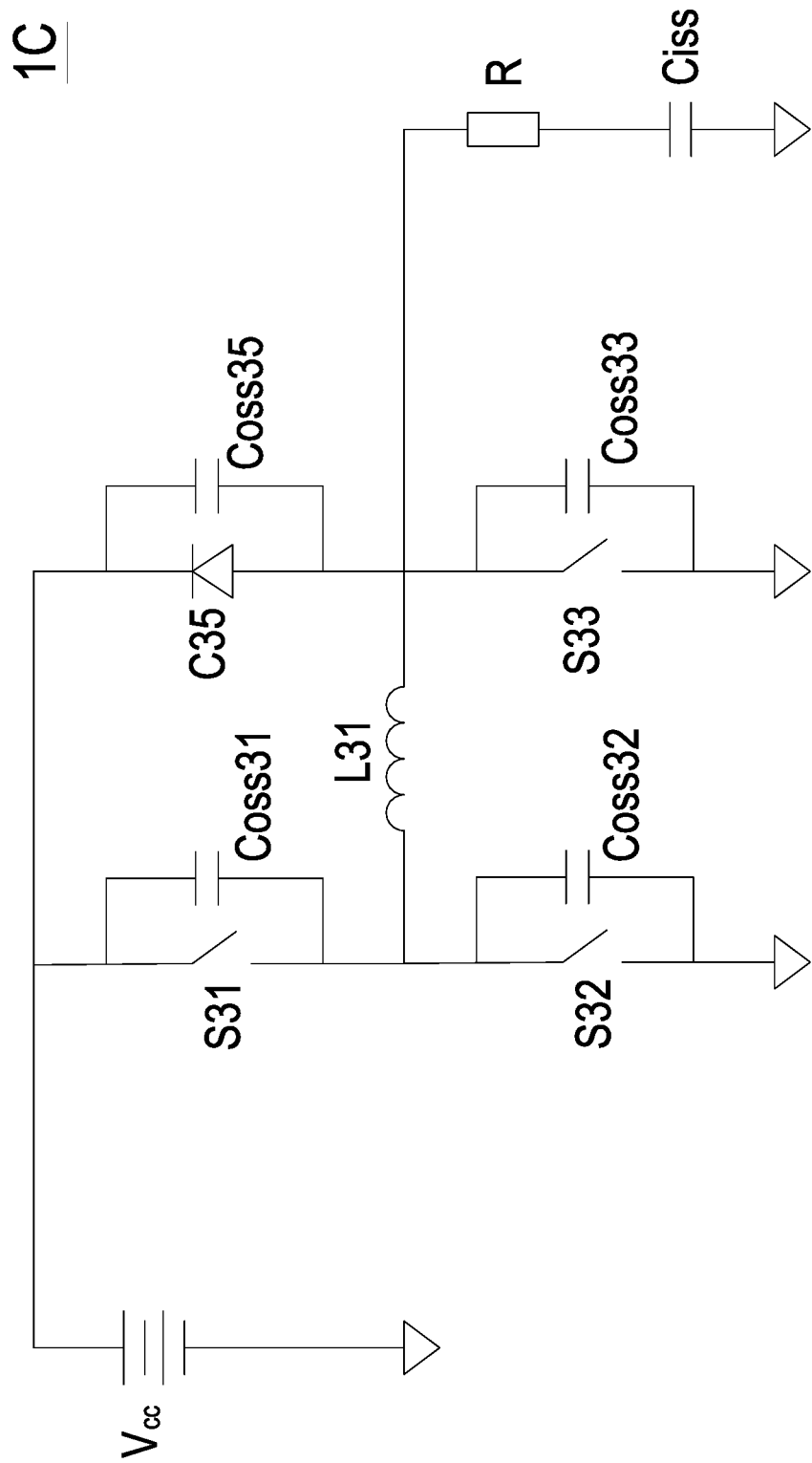
FIG. 14 is a schematic circuit diagram illustrating a driving circuit for a power switch according to a fourth embodiment of the present invention.

FIG. 14 is a schematic circuit diagram illustrating a driving circuit for a power switch according to a fourth embodiment of the present invention. Component parts and elements corresponding to those of the first embodiment are designated by identical numeral references, and detailed descriptions thereof are omitted. In comparison with the driving circuit 1 of FIG. 6, the driving circuit 1C of the present invention further comprises a first clamping circuit C35 and a third driving switch C33. The first clamping circuit C35 comprises a third parasitic capacitor Coss35. The third driving switch C33 comprises a fourth parasitic capacitor Coss33. The first terminal of the first clamping circuit C35 is connected with the first terminal of the first driving switch S31 and the input power source. The second terminal of the first clamping circuit C35 is connected with the second terminal of the inductor L31, the first terminal of the third driving switch C33 and the first terminal of the resistor R. The second terminal of the third driving switch C33 is connected with the ground terminal.

The driving circuit 1C is substantially equivalent to the equivalent circuit 2 of FIG. 9. However, the first equivalent capacitor Ci of this embodiment is related to the input capacitor Ciss of the power switch, the third parasitic capacitor Coss35 of the first clamping circuit C35 and the fourth parasitic capacitor Coss33 of the third driving switch C33.

Figure 15:
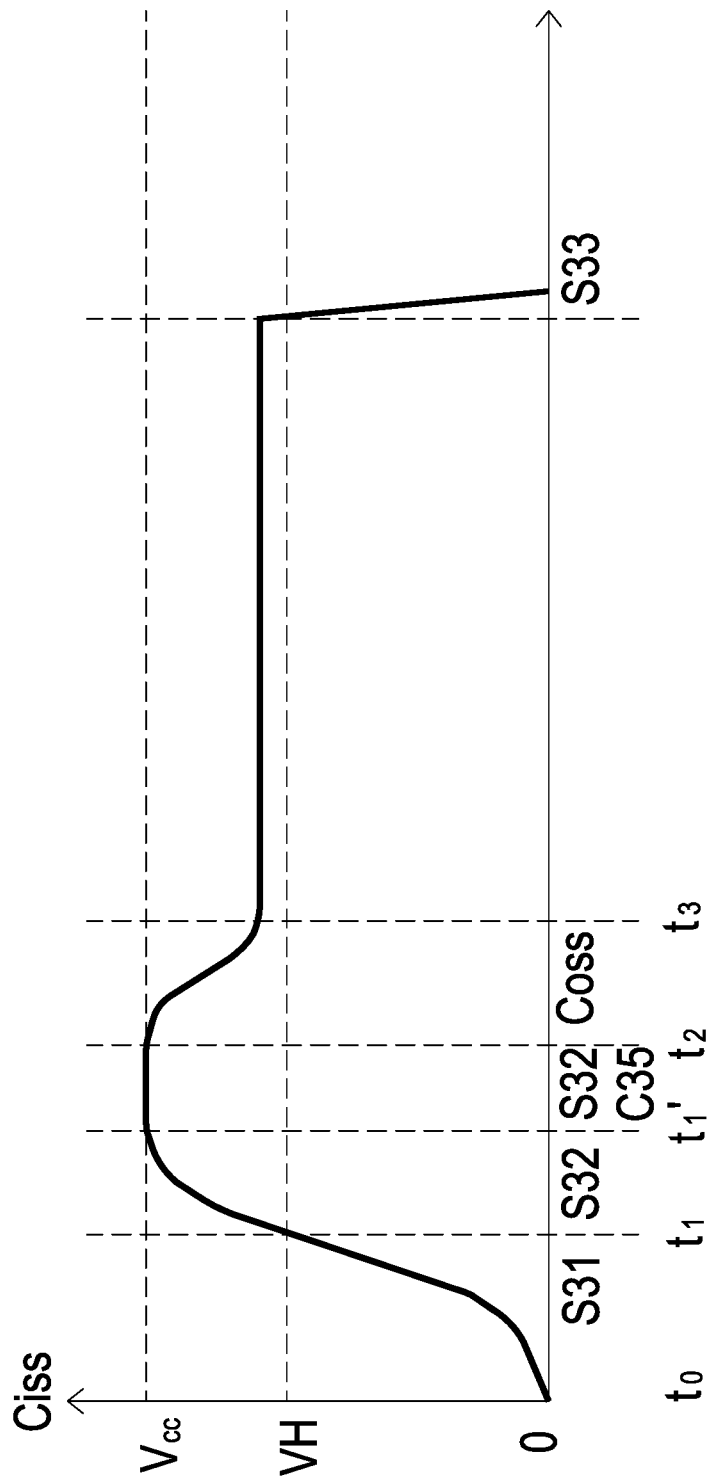
FIG. 15 is a schematic timing waveform diagram illustrating associated voltage signals of the driving circuit of FIG. 14 in the charging procedure of the input capacitor.

FIG. 15 is a schematic timing waveform diagram illustrating associated voltage signals of the driving circuit of FIG. 14 in the charging procedure of the input capacitor. Please refer to FIGS. 9, 14 and 15. The charging and discharging procedures of this embodiment are distinguished from those of the first embodiment. When the voltage of the input capacitor Ciss is charged to the voltage exceeding an over-voltage value in the time interval between t1' and t2, the voltage of the input capacitor Ciss is clamped to the over-voltage value by the first clamping circuit C35. In this embodiment, the over-voltage value is the supply voltage Vcc. In other words, the voltage Vp1 is very close to the supply voltage Vcc in the charging procedure of the input capacitor Ciss. After the voltage of the input capacitor Ciss reaches the first steady voltage Vo$_1$ for a specified time period (e.g., at the time point t3'), the third driving switch S33 is turned on. Since the voltage of the input capacitor Ciss reduces to zero, the speed of turning off the power switch (not shown) is increased. As mentioned above, the first equivalent capacitor Ci is related to the input capacitor Ciss of the power switch, the third parasitic capacitor Coss35 of the first clamping circuit C35 and the fourth parasitic capacitor Coss33 of the third driving switch C33. Consequently, in the charging procedure of the first equivalent capacitor Ci, the relationships between Q1, Q2, Coss31, Coss32, Coss33, Coss35, Ciss, Vp1, VH and Vo$_1$ satisfy the following formulae (16), (17) and (18):

$$Q1=(Coss31+Coss32) \times Vo_1 \quad (16)$$

$$Q2=(Ciss+Coss33+Coss35) \times (Vp1-VH) \quad (17)$$

$$Q1 \leq Q2 \quad (18)$$

Figure 16:
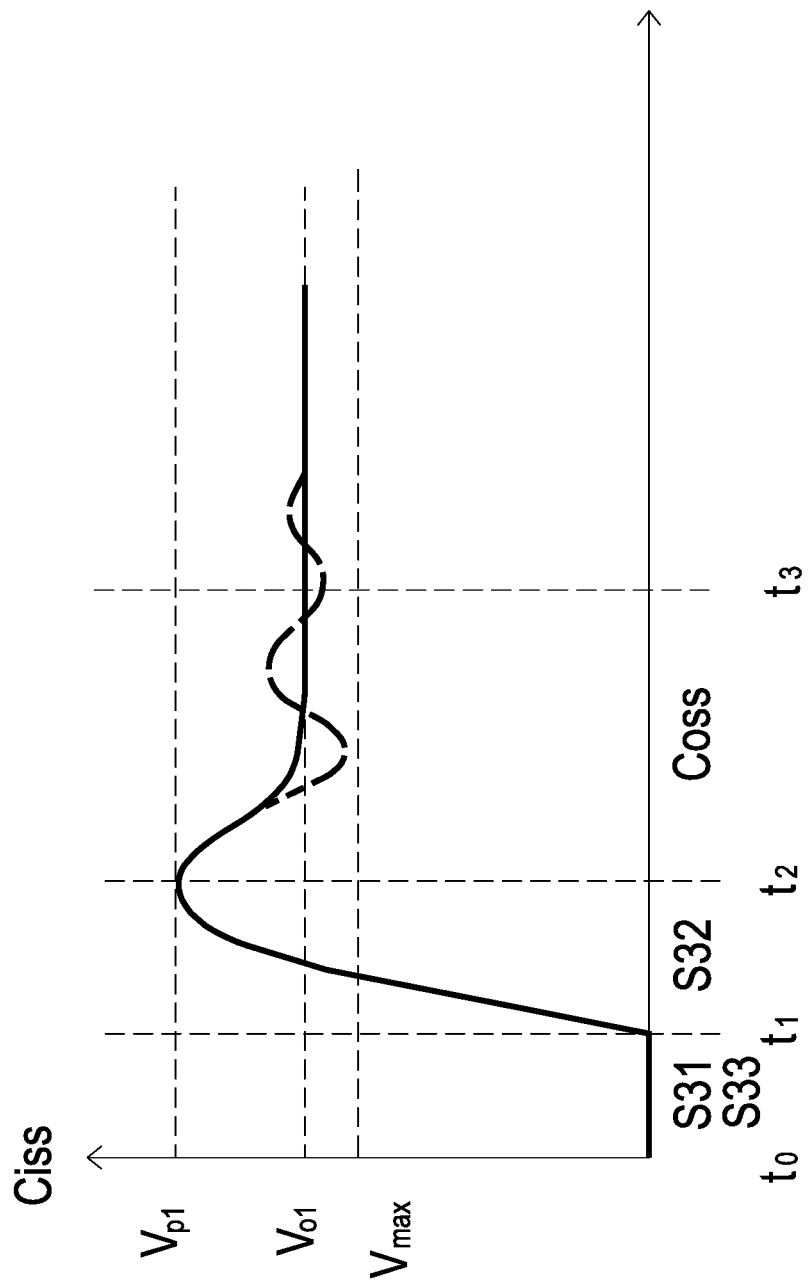
FIG. 16 is another schematic timing waveform diagram illustrating associated voltage signals of the driving circuit of FIG. 14 in the charging procedure of the input capacitor.

FIG. 16 is another schematic timing waveform diagram illustrating associated voltage signals of the driving circuit of FIG. 14 in the charging procedure of the input capacitor. The charging procedure of FIG. 16 is distinguished from the charging procedure of FIG. 15. For charging the input capacitor Ciss, the first driving switch S31 and the third driving switch S33 are turned on in the time interval between t0 and t1. Consequently, the electric energy from the input power source charges the inductor L31 and the input capacitor Ciss through the first driving switch S31, the inductor L31 and the third driving switch S33 until the current flowing the inductor L31 reaches a predetermined value. At the time point t1, the first driving switch S31 and the third driving switch S33 are turned off and the second driving switch S32 is turned on. Consequently, the input capacitor Ciss is continuously charged by the current of the inductor L31. Since the current of the inductor L31 has been previously charged to the predetermined value, a larger charging current provides to the input capacitor Ciss. In other words, the input capacitor Ciss is charged at a faster speed. The charging procedure in the interval between t1 and t3 is similar to that of the first embodiment, and is not redundantly described herein.

Figure 17:
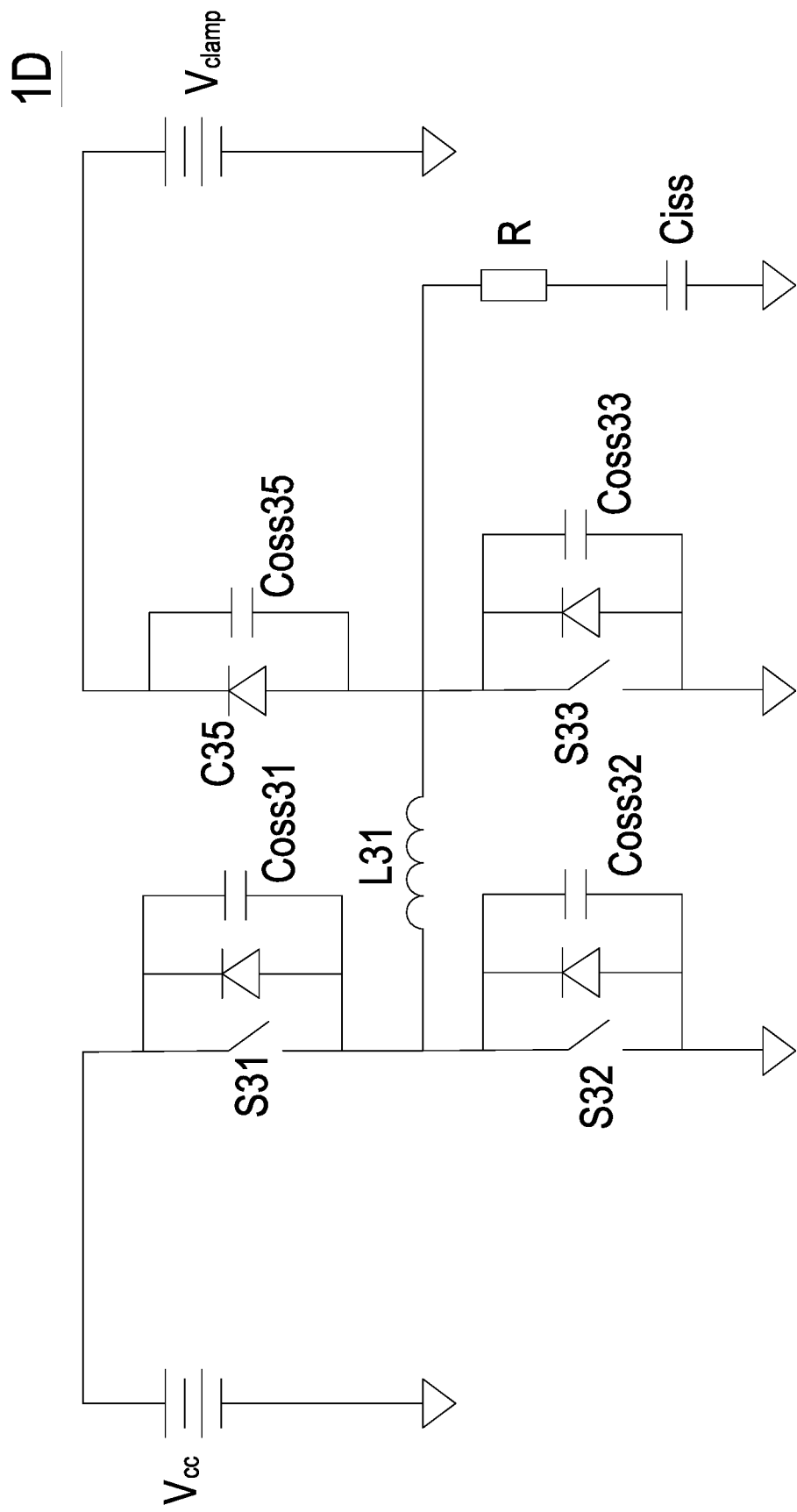
FIG. 17 is a schematic circuit diagram illustrating a driving circuit for a power switch according to a fifth embodiment of the present invention.

FIG. 17 is a schematic circuit diagram illustrating a driving circuit for a power switch according to a fifth embodiment of the present invention. Component parts and elements corresponding to those of the driving circuit of FIG. 14 are designated by identical numeral references, and detailed descriptions thereof are omitted. In comparison with the driving circuit 1C of FIG. 14, the driving circuit 1D of this embodiment further comprises a DC clamping power source Vclamp. Moreover, the first terminal of the first clamping circuit C35 is electrically connected with the DC clamping power source Vclamp.

Figure 18:
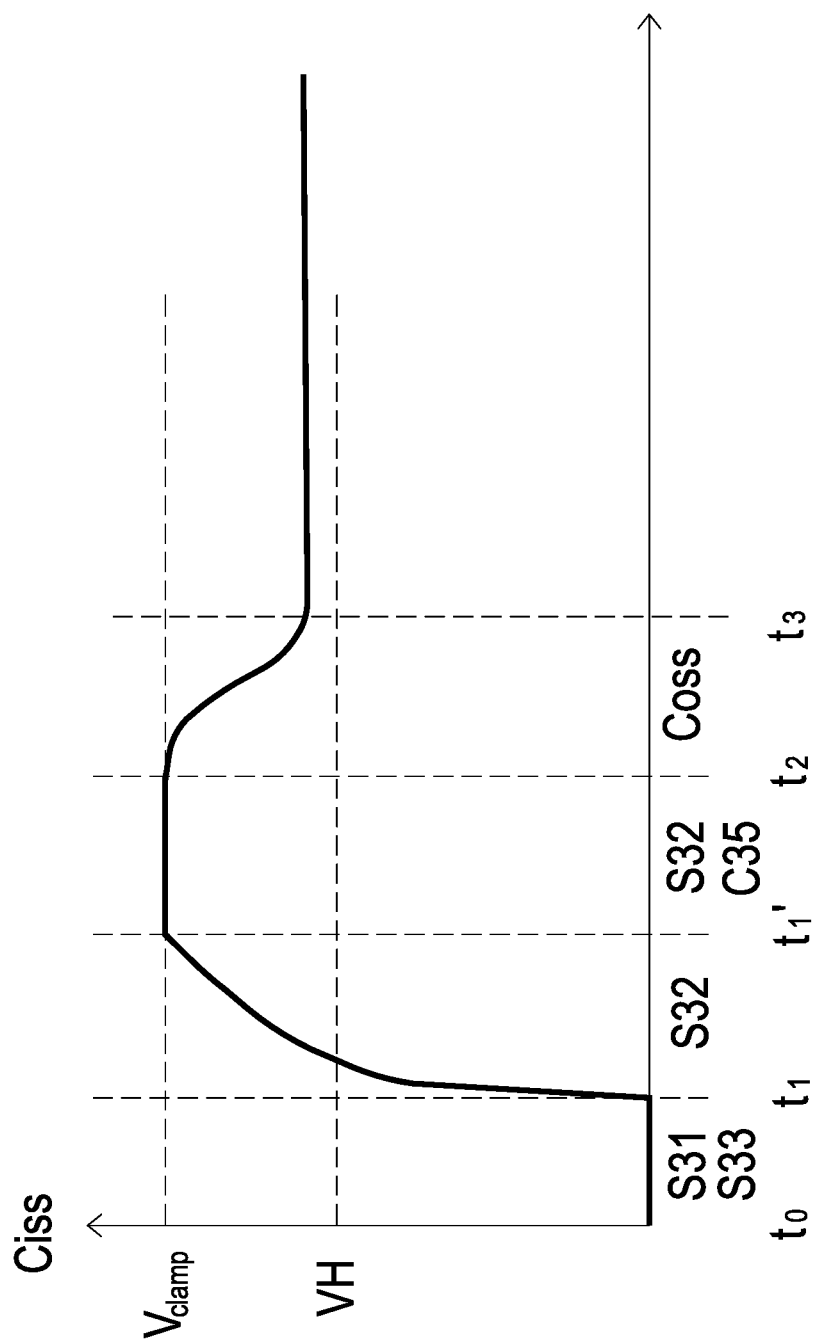
FIG. 18 is a schematic timing waveform diagram illustrating associated voltage signals of the driving circuit of FIG. 17 in the charging procedure of the input capacitor.

FIG. 18 is a schematic timing waveform diagram illustrating associated voltage signals of the driving circuit of FIG. 17 in the charging procedure of the input capacitor. When the voltage of the input capacitor Ciss is charged to the voltage exceeding an over-voltage value in the time interval between t1' and t2, the voltage of the input capacitor Ciss is clamped to the over-voltage value by the DC clamping power source Vclamp. In this embodiment, the over-voltage value is the supply voltage of the DC clamping power source Vclamp. In other words, the voltage of the input capacitor Ciss is very close to the supply voltage of the DC clamping power source Vclamp in the charging procedure of the input capacitor Ciss.

Figure 19:
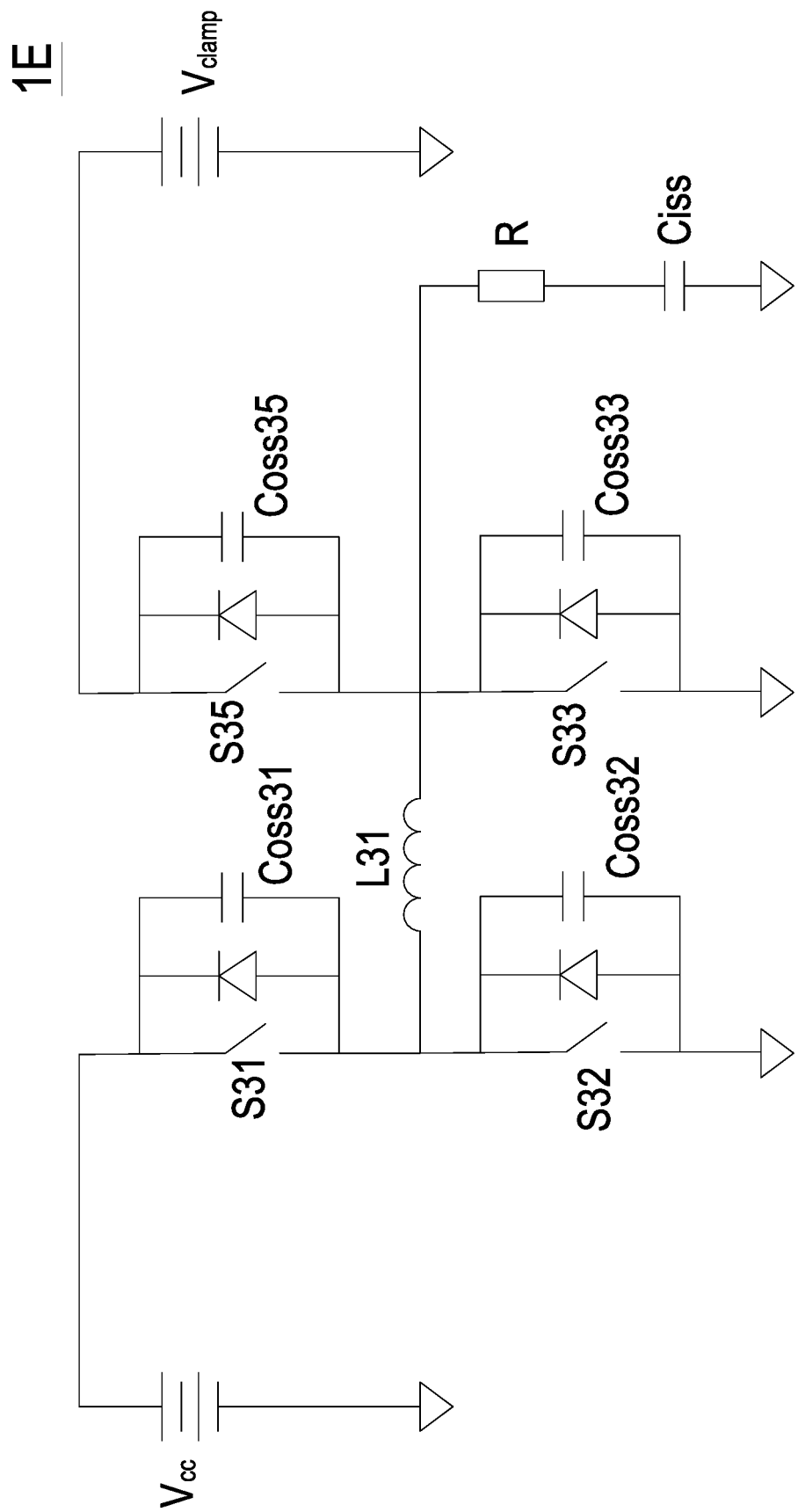
FIG. 19 is a schematic circuit diagram illustrating a driving circuit for a power switch according to a sixth embodiment of the present invention.

FIG. 19 is a schematic circuit diagram illustrating a driving circuit for a power switch according to a sixth embodiment of the present invention. Component parts and elements corresponding to those of the driving circuit of FIG. 17 are designated by identical numeral references, and detailed descriptions thereof are omitted. In comparison with the driving circuit 1D of FIG. 17, the driving circuit 1E of this embodiment further comprises a fourth driving switch S35 in replace of the first clamping circuit C35.

Figure 20:
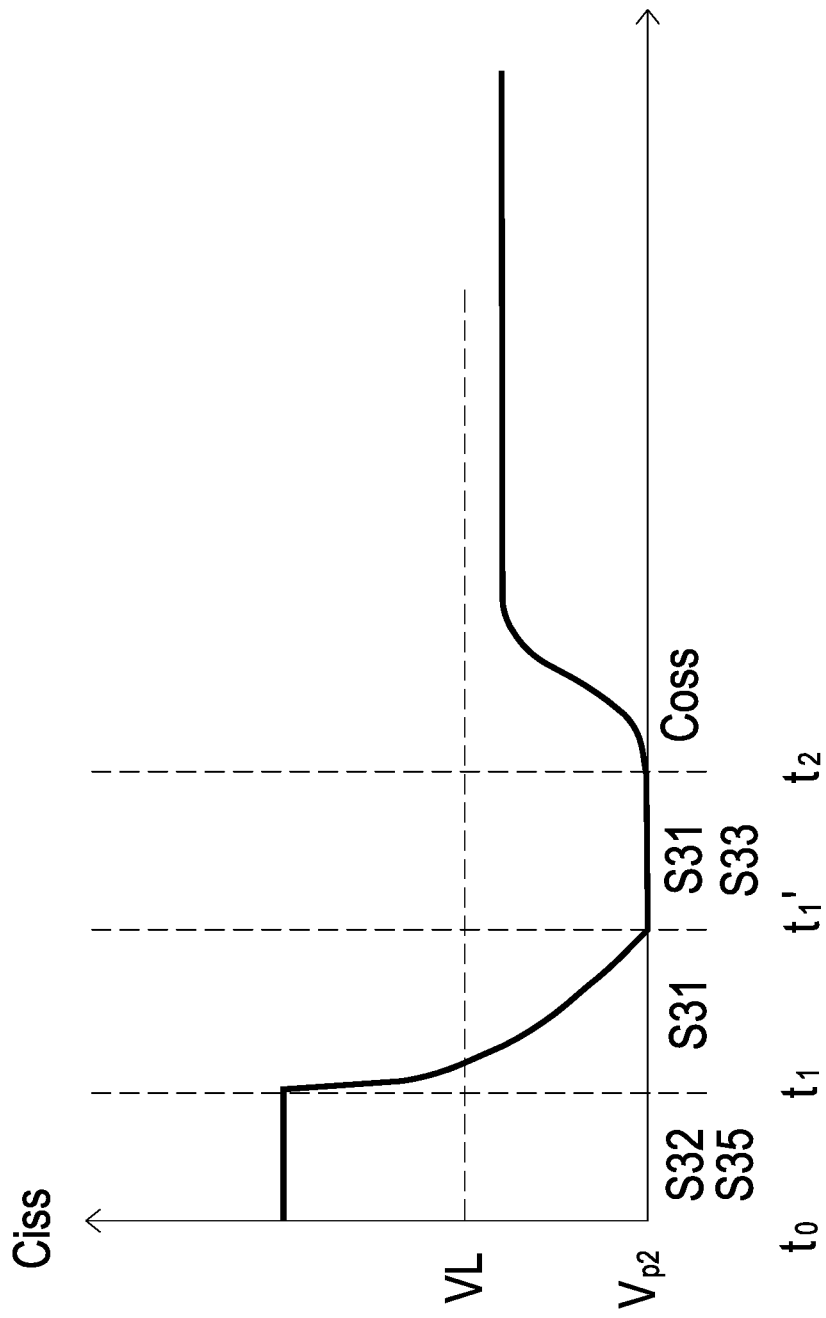
FIG. 20 is a schematic timing waveform diagram illustrating associated voltage signals of the driving circuit of FIG. 19 in the discharging procedure of the input capacitor.

FIG. 20 is a schematic timing waveform diagram illustrating associated voltage signals of the driving circuit of FIG. 19 in the discharging procedure of the input capacitor. For discharging the input capacitor Ciss, the second driving switch S32 and the fourth driving switch S35 are turned on in the time interval between t0 and t1. Consequently, the electric energy of the DC clamping power source Vclamp charges the inductor L31 through the fourth driving switch S35, the inductor L31 and the second driving switch S32 until the current flowing through the inductor L31 reaches a predetermined value. At the time point t1 when the current of the inductor L31 reaches the predetermined value, the second driving switch S32 and the fourth driving switch S35 are turned off, and the first driving switch S31 is turned on. Since the current of the inductor L31 has been previously charged to the predetermined value, the input capacitor Ciss is discharged at a faster speed. At the time point t1' when the voltage of the input capacitor Ciss is discharged to 0V, the third driving switch is turned on. Consequently, the voltage of the input capacitor Ciss is clamped to 0V.

Figure 21:
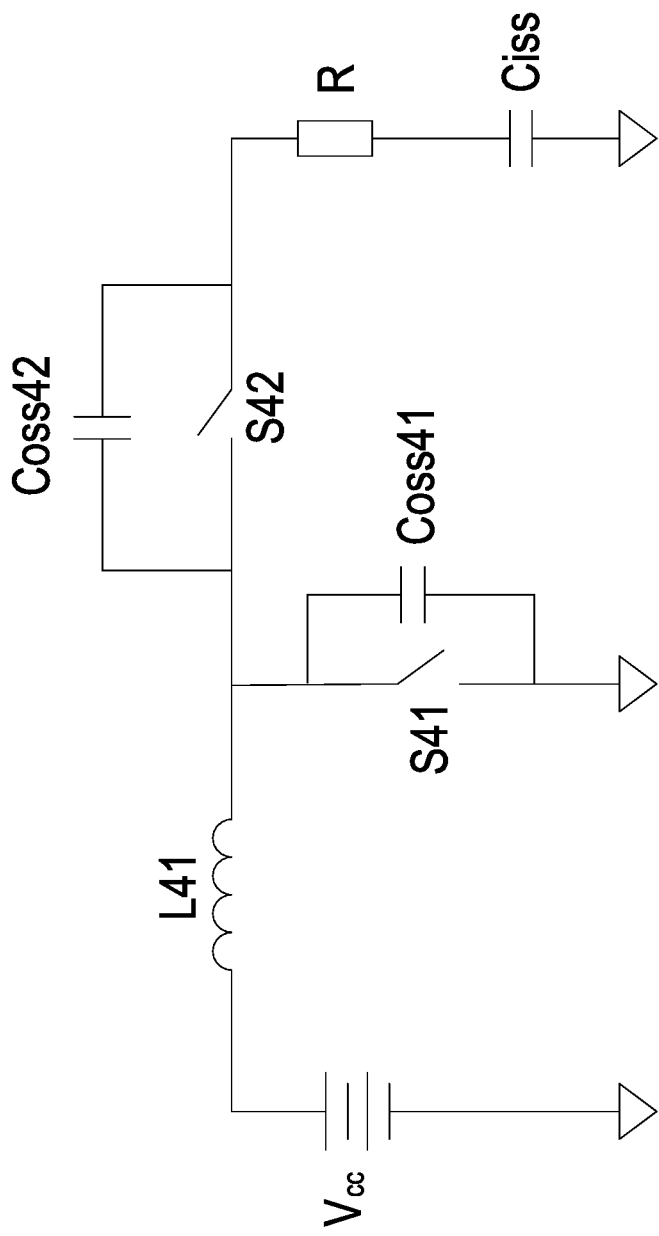
FIG. 21 is a schematic circuit diagram illustrating a driving circuit for a power switch according to a seventh embodiment of the present invention.

FIG. 21 is a schematic circuit diagram illustrating a driving circuit for a power switch according to a seventh embodiment of the present invention. As shown in FIG. 21, the driving circuit 2A comprises an inductor L41, a first driving switch S41, a second driving switch S42 and a resistor R. The capacitor Ciss is an input capacitor of the power switch (not shown). The first terminal of the inductor L41 is electrically connected with an input power source. The second terminal of the inductor L41 is electrically connected with the first terminal of the first driving switch S41 and the first terminal of the second driving switch S42. The second terminal of the second driving switch S42 is electrically connected with the first terminal of the resistor R. The second terminal of the resistor R is electrically connected with the input capacitor Ciss. The second terminal of the first driving switch S41 is electrically connected with a ground terminal. Moreover, the parasitic parameter of the first driving switch S41 is a first parasitic capacitor Coss41, and the parasitic parameter of the second driving switch S42 is a second parasitic capacitor Coss42.

The operations of charging and discharging the input capacitor Ciss will be described as follows. In this embodiment, the first driving switch S41 and the second driving switch S42 are selectively turned on or turned off to control the charging and discharging procedures of the input capacitor Ciss.

Figure 22:
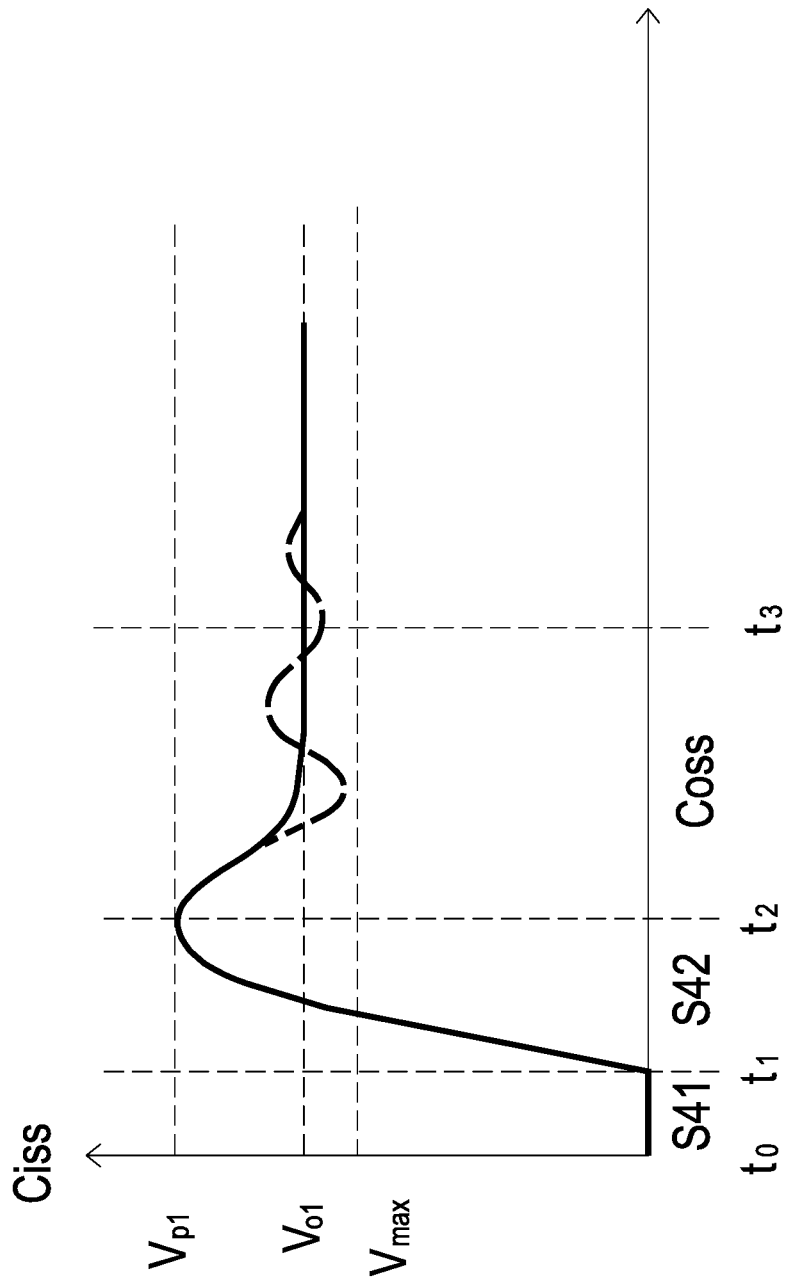
FIG. 22 is a schematic timing waveform diagram illustrating associated voltage signals of the driving circuit of FIG. 21 in the charging procedure of the input capacitor.

FIG. 22 is a schematic timing waveform diagram illustrating associated voltage signals of the driving circuit of FIG. 21 in the charging procedure of the input capacitor. For charging the input capacitor Ciss, the first driving switch S41 is turned on in the time interval between t0 and t1. Consequently, the electric energy of the supply voltage Vcc of the input power source charges the inductor L41 through the first driving switch S41. At the time point t1, the first driving switch S41 is turned off and the second driving switch S42 is turned on. Consequently, the input capacitor Ciss is charged by the current of the inductor L41 until the current of the inductor L41 is zero (i.e., at the time point t2). Meanwhile, the input capacitor Ciss is charged to the voltage Vp1. The first steady voltage Vo$_1$ is higher than or equal to the supply voltage Vcc of the input power source. Moreover, at the time point t2, the first parasitic capacitor Coss41 is charged to the voltage Vp1, and the second parasitic capacitor Coss42 is 0V. Consequently, in the time interval between t2 and t3, the second parasitic capacitor Coss42 resonates with the input capacitor Ciss through the inductor L41. Due to the resonant oscillation, the voltage of the input capacitor Ciss gradually fluctuates from Vp1 to a first steady voltage Vo$_1$, the voltage of the second parasitic capacitor Coss42 gradually fluctuates from 0V to the voltage (Vo$_1$-Vcc), and the voltage of the first parasitic capacitor Coss41 is equal to the supply voltage Vcc. The input capacitor Ciss is serially connected with the second parasitic capacitor Coss42 of the second driving switch S42. Consequently, in the time interval between t2 and t3, the amount of charges discharged from the input capacitor Ciss (i.e., from Vp1 to Vo$_1$) is Q1. Moreover, Q1 is equal to the change amount of charges in the second parasitic capacitor Coss42 while the voltage is changed from 0V to the voltage (Vo$_1$-Vcc). When the voltage of the input capacitor Ciss reaches the first steady voltage Vo$_1$, the first steady voltage Vo$_1$ must be higher than the first set voltage VH. Consequently, in the time interval between t2 and t3, the change amount of charges of the input capacitor Ciss from Vp1 to VH is equal to Q2. Especially, Q2 is higher than or equal to Q1. That is, in the charging procedure of the input capacitor Ciss, the relationships between Q1, Q2, Coss42, Ciss, Vp1, VH and Vo1 satisfy the following formulae (19), (20) and (21):

$$Q1 = Coss42 \times (Vo_1 - Vcc) \quad (19)$$

$$Q2 = Ciss \times (Vp1 - VH) \quad (20)$$

$$Q1 \leq Q2 \quad (21)$$

Figure 23:
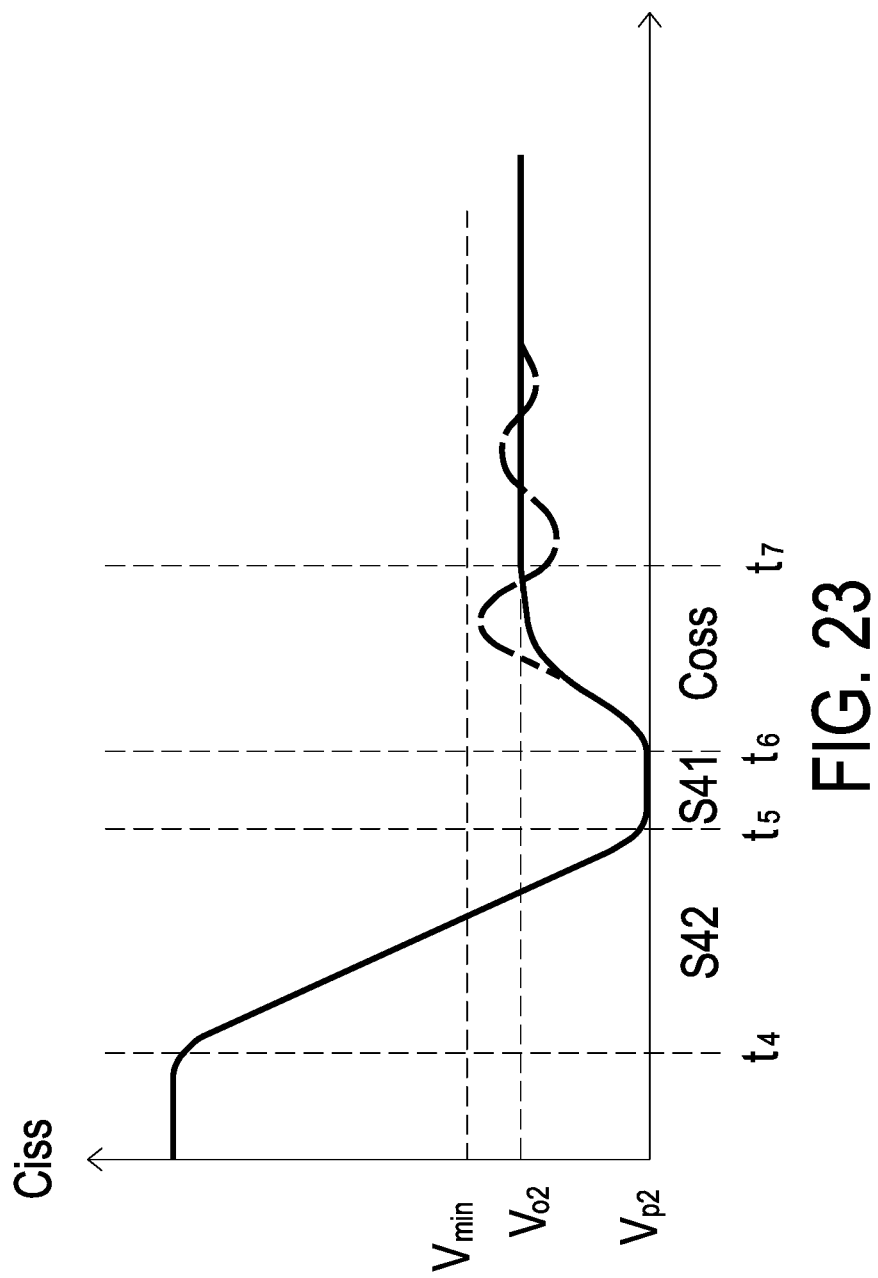
FIG. 23 is a schematic timing waveform diagram illustrating associated voltage signals of the driving circuit of FIG. 21 in the discharging procedure of the input capacitor.

FIG. 23 is a schematic timing waveform diagram illustrating associated voltage signals of the driving circuit of FIG. 21 in the discharging procedure of the input capacitor. For discharging the input capacitor Ciss, the second driving switch S42 is turned on in the time interval between t4 and t5. Consequently, the input capacitor Ciss discharges electricity, and the current flowing through the inductor L41 increases. At the time point t5 when the current of the inductor L41 reaches a predetermined value, the second driving switch S42 is turned off and the first driving switch S41 is turned on. Consequently, the input inductor L41 discharges electricity to the input power source, and the current of the inductor L41 gradually decreases until the current of the inductor L41 is zero (i.e., at the time point t6). Meanwhile, the voltage of the input capacitor Ciss is reduced to the voltage Vp2. Moreover, at the time point t6, the first parasitic capacitor Coss41 is discharged to 0V, and the second parasitic capacitor Coss42 is charged to Vp2. Consequently, in the time interval between second parasitic capacitor Coss42 resonates with the input capacitor Ciss through the inductor L41. Due to the resonant oscillation, the voltage of the input capacitor Ciss gradually fluctuates from Vp2 to a second steady voltage Vo$_2$, the voltage of the second parasitic capacitor Coss42 gradually fluctuates to (Vcc-Vo$_2$), and the voltage of the first parasitic capacitor Coss41 gradually fluctuates to Vcc. The input capacitor Ciss is serially connected with the second parasitic capacitor Coss42 of the second driving switch S42. Consequently, in the time interval between t6 and t7, the amount of charges charged into the input capacitor Ciss (i.e., from Vp2 to Vo$_2$) is Q3. Moreover, Q3 is equal to the change amount of charges in the second parasitic capacitor Coss42 while the voltage is changed from Vp2 to (Vcc-Vo$_2$). When the voltage of the input capacitor Ciss reaches the second steady voltage Vo$_2$, the second steady voltage Vo$_2$ must be lower than the second set voltage VL. Consequently, in the time interval between t6 and t7, the change amount of charges of the input capacitor Ciss from Vp2 to VL is equal to Q4. Especially, Q4 is higher than or equal to Q3. That is, in the discharging procedure of the input capacitor Ciss, the relationships between Q3, Q4, Coss42, Ciss, Vp2, VL, Vcc and Vo1 satisfy the following formulae (22), (23) and (24):

$$Q3 = Coss42 \times (Vp2 + Vcc - Vo_2) \quad (22)$$

$$Q4 = Ciss \times (Vp2 - VL) \quad (23)$$

$$Q3 \leq Q4 \quad (24)$$

In the above embodiment, the first driving switch S41 may be a MOSFET with a parallel-connected body diode and the second driving switch S42 may be a bidirectional switch. Preferably, the voltage Vp2 is 0V. If the on duration of the second driving switch S42 is too long, the body diode of the first driving switch S41 is turned on or the input capacitor Ciss is inversely charged. Under this circumstance, the voltage Vp2 is lower than 0V, the oscillation extent of the voltage of the input capacitor Ciss is too large, and the energy loss increases.

The driving circuit 2A is substantially equivalent to the equivalent circuit 2 of FIG. 9. However, the first equivalent capacitor Ci of this embodiment is related to the input capacitor Ciss of the power switch, the equivalent inductor L comprises the inductor L41, and the second equivalent capacitor Coss is related to the second parasitic capacitor Coss42 of the second driving switch S42.

Figure 24:
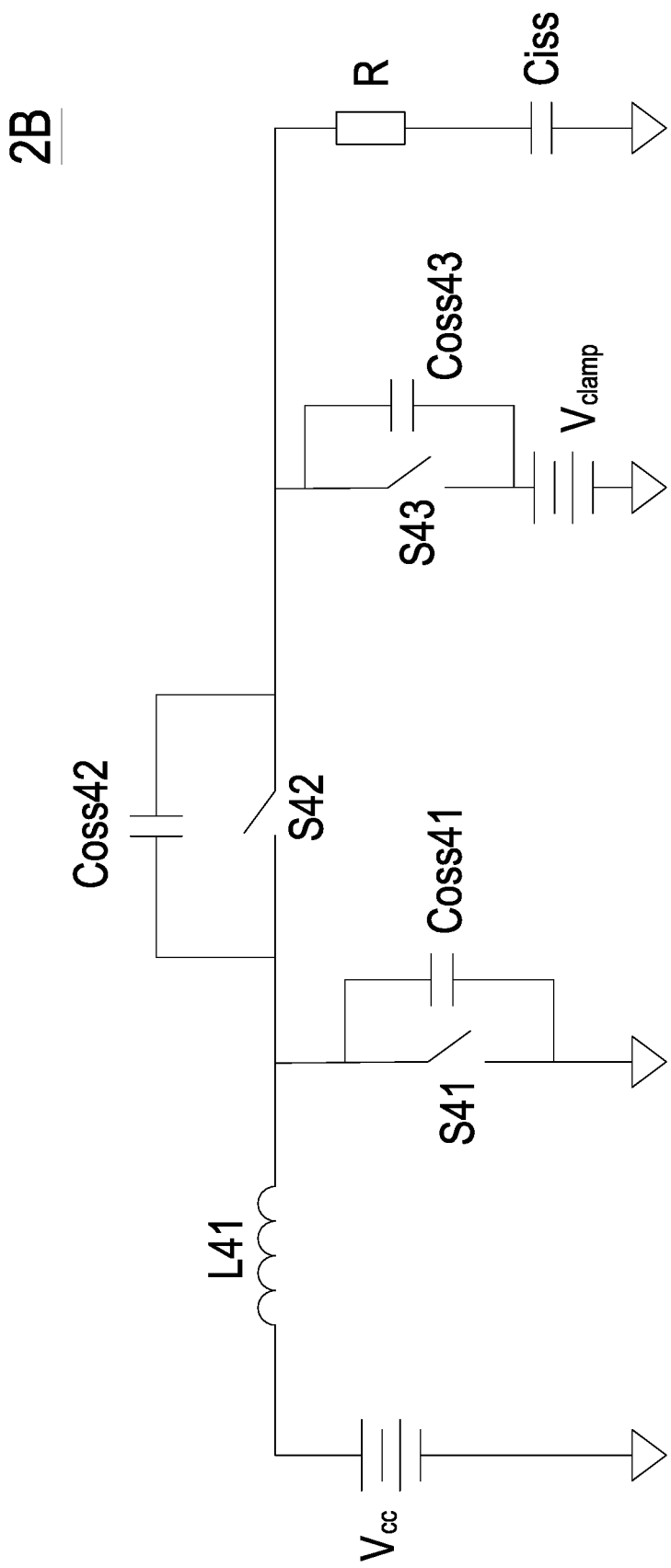
FIG. 24 is a schematic circuit diagram illustrating a driving circuit for a power switch according to an eighth embodiment of the present invention.

FIG. 24 is a schematic circuit diagram illustrating a driving circuit for a power switch according to an eighth embodiment of the present invention. Component parts and elements corresponding to those of the driving circuit of FIG. 21 are designated by identical numeral references, and detailed descriptions thereof are omitted. In comparison with the driving circuit 2A of FIG. 21, the driving circuit 2B of this embodiment further comprises a third driving switch S43 and a DC clamping power source Vclamp. The third driving switch S43 has a third parasitic capacitor Coss43. The first terminal of the third driving switch S43 is electrically connected with the second terminal of the second driving switch S42 and the first terminal of the resistor R. The DC clamping power source Vclamp is connected between the second terminal of the third driving switch S43 and the ground terminal.

The driving circuit 2B is substantially equivalent to the equivalent circuit 2 of FIG. 9. However, the first equivalent capacitor Ci of this embodiment is related to the input capacitor Ciss of the power switch and the third parasitic capacitor Coss43 of the third driving switch S43.

Figure 25:
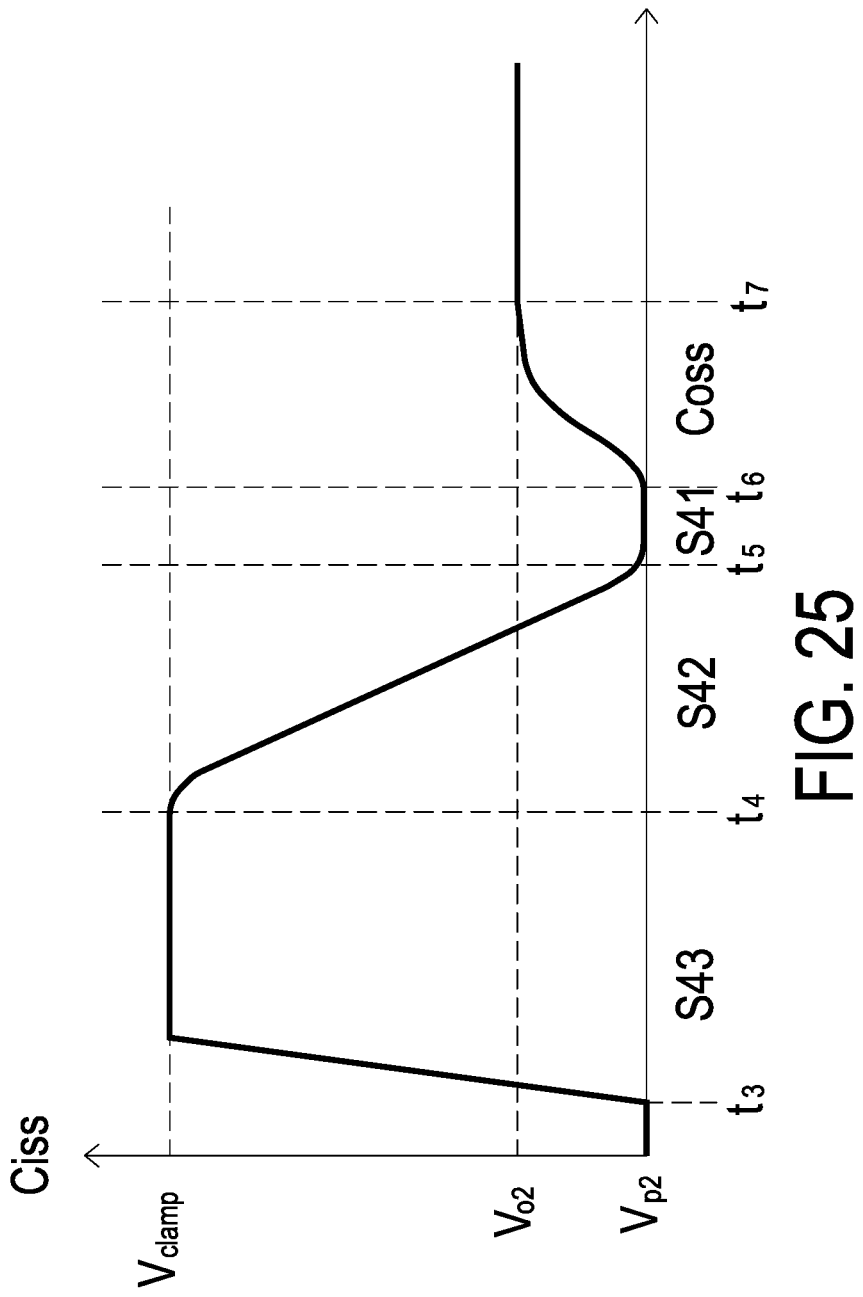
FIG. 25 is a schematic timing waveform diagram illustrating associated voltage signals of the driving circuit of FIG. 24 in the charging procedure of the input capacitor.

FIG. 25 is a schematic timing waveform diagram illustrating associated voltage signals of the driving circuit of FIG. 24 in the charging procedure of the input capacitor. Please refer to FIGS. 9, 24 and 25. In the charging procedure, the third driving switch S43 is turned on in the time interval between t0 and t1. Consequently, the DC clamping power source Vclamp releases electric energy to charge the input capacitor Ciss. Consequently, the input capacitor Ciss is charged at a faster speed. The discharging procedure is similar to that of the seventh embodiment, and is not redundantly described herein. As mentioned above, the first equivalent capacitor Ci of this embodiment is related to the input capacitor Ciss of the power switch and the third parasitic capacitor Coss43 of the third driving switch S43. Consequently, the discharging procedure of the first equivalent capacitor Ci, the relationships between Q3, Q4, Coss42, Coss43, Ciss, Vp2, VL, Vcc and Vo$_2$ satisfy the following formulae (25), (26) and (27):

$$Q3=Coss42\times(Vp2+Vcc-Vo_2) \quad (25)$$

$$Q4=(Ciss+Coss43)\times(Vp2-VL) \quad (26)$$

$$Q3 \leq Q4 \quad (27)$$

Figure 26:
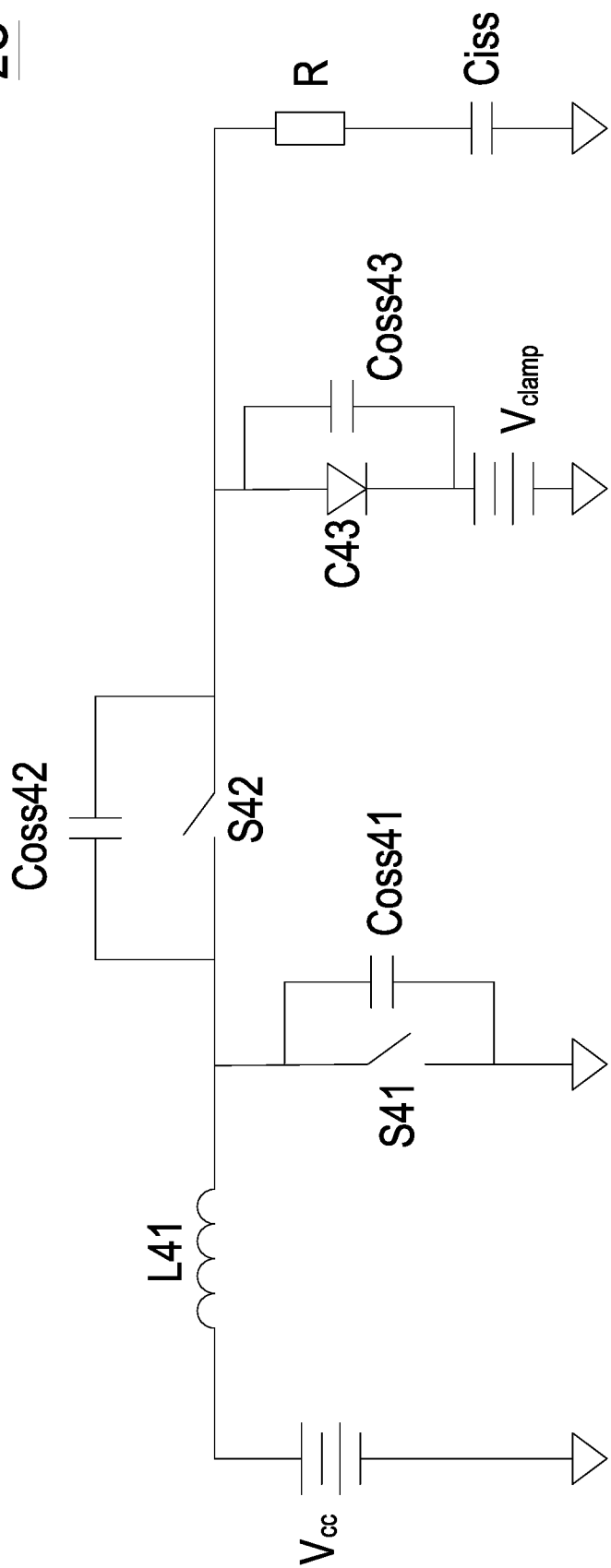
FIG. 26 is a schematic circuit diagram illustrating a driving circuit for a power switch according to a ninth embodiment of the present invention.

FIG. 26 is a schematic circuit diagram illustrating a driving circuit for a power switch according to a ninth embodiment of the present invention. Component parts and elements corresponding to those of the driving circuit of FIG. 21 are designated by identical numeral references, and detailed descriptions thereof are omitted. In comparison with the driving circuit 2A of FIG. 21, the driving circuit 2C of this embodiment further comprises a first clamping circuit C43 and a DC clamping power source Vclamp. The first clamping circuit C43 has a third parasitic capacitor Coss43. The first terminal of the first clamping circuit C43 is electrically connected with the second terminal of the second driving switch S42 and the first terminal of the resistor R. The DC clamping power source Vclamp is connected between the second terminal of the first clamping circuit C43 and the ground terminal.

The driving circuit 2C is substantially equivalent to the equivalent circuit 2 of FIG. 9. However, the first equivalent capacitor Ci of this embodiment is related to the input capacitor Ciss of the power switch and the third parasitic capacitor Coss43 of the first clamping circuit C43.

Figure 27:
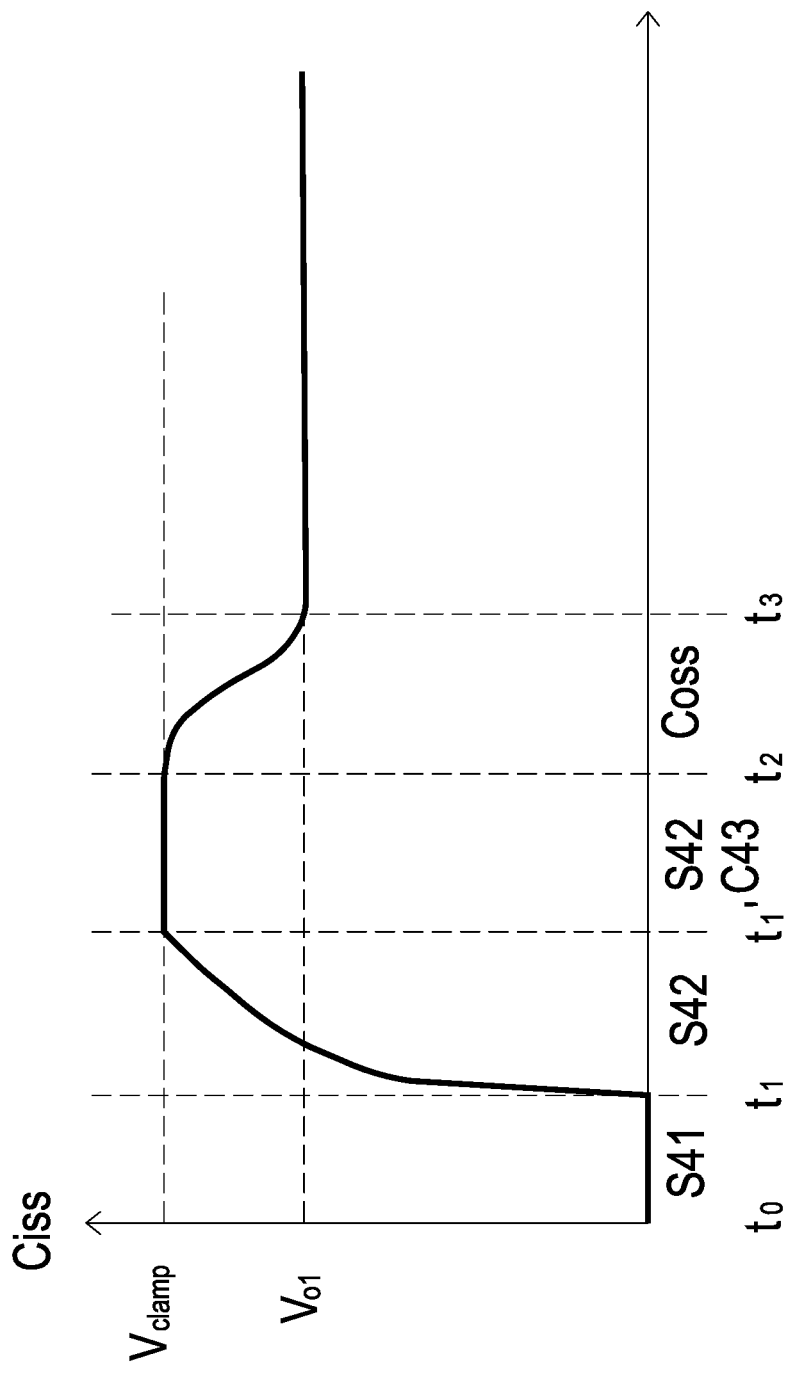
FIG. 27 is a schematic timing waveform diagram illustrating associated voltage signals of the driving circuit of FIG. 26 in the charging procedure of the input capacitor.

FIG. 27 is a schematic timing waveform diagram illustrating associated voltage signals of the driving circuit of FIG. 26 in the charging procedure of the input capacitor. Please refer to FIGS. 9, 26 and 27. The charging procedure of this embodiment is distinguished from that of the seventh embodiment. When the voltage of the input capacitor Ciss is charged to the voltage exceeding the voltage of the DC clamping power source Vclamp in the time interval between t1' and t2, the voltage of the input capacitor Ciss is clamped to the voltage of the DC clamping power source Vclamp by the first clamping circuit C43. Since the voltage of the input capacitor Ciss is not too high, the power switch is not damaged and the ease of controlling the second driving switch S42 in the charging procedure is enhanced. As mentioned above, the first equivalent capacitor Ci is related to the input capacitor Ciss of the power switch and the third parasitic capacitor Coss43 of the first clamping circuit C43. Consequently, in the charging procedure of the first equivalent capacitor Ci, the relationships between Q1, Q2, Coss42, Coss43, Ciss, Vclamp, Vcc, VH and Vo$_1$ satisfy the following formulae (28), (29) and (30):

$$Q1=Coss42\times(Vo_1-Vcc) \quad (28)$$

$$Q2=(Ciss+Coss43)\times(Vclamp-VH) \quad (29)$$

$$Q1 \leq Q2 \quad (30)$$

Figure 28:
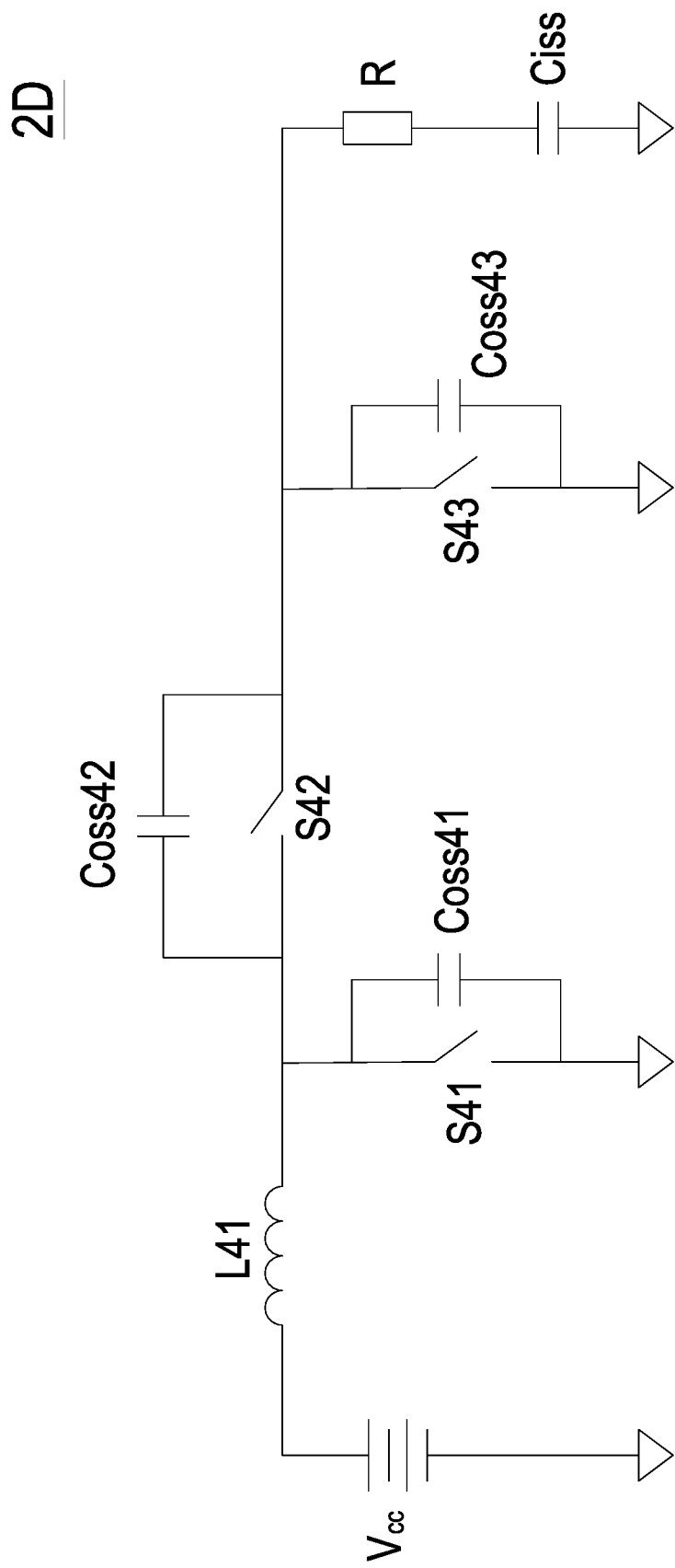
FIG. 28 is a schematic circuit diagram illustrating a driving circuit for a power switch according to a tenth embodiment of the present invention.

FIG. 28 is a schematic circuit diagram illustrating a driving circuit for a power switch according to a tenth embodiment of the present invention. Component parts and elements corresponding to those of the driving circuit of FIG. 21 are designated by identical numeral references, and detailed descriptions thereof are omitted. In comparison with the driving circuit 2A of FIG. 21, the driving circuit 2D of this embodiment further comprises a third driving switch S43. The third driving switch S43 has a third parasitic capacitor Coss43. The first terminal of the third driving switch S43 is electrically connected with the second terminal of the second driving switch S42 and the first terminal of the resistor R. The second terminal of the third driving switch S43 is electrically connected with the ground terminal. The third driving switch S43 is turned on to control the discharging procedure of the input capacitor Ciss. Consequently, the input capacitor Ciss is discharged at a faster speed.

The driving circuit 2D is substantially equivalent to the equivalent circuit 2 of FIG. 9. However, the first equivalent capacitor Ci of this embodiment is related to the input capacitor Ciss of the power switch and the third parasitic capacitor Coss43 of the third driving switch S43.

Figure 29:
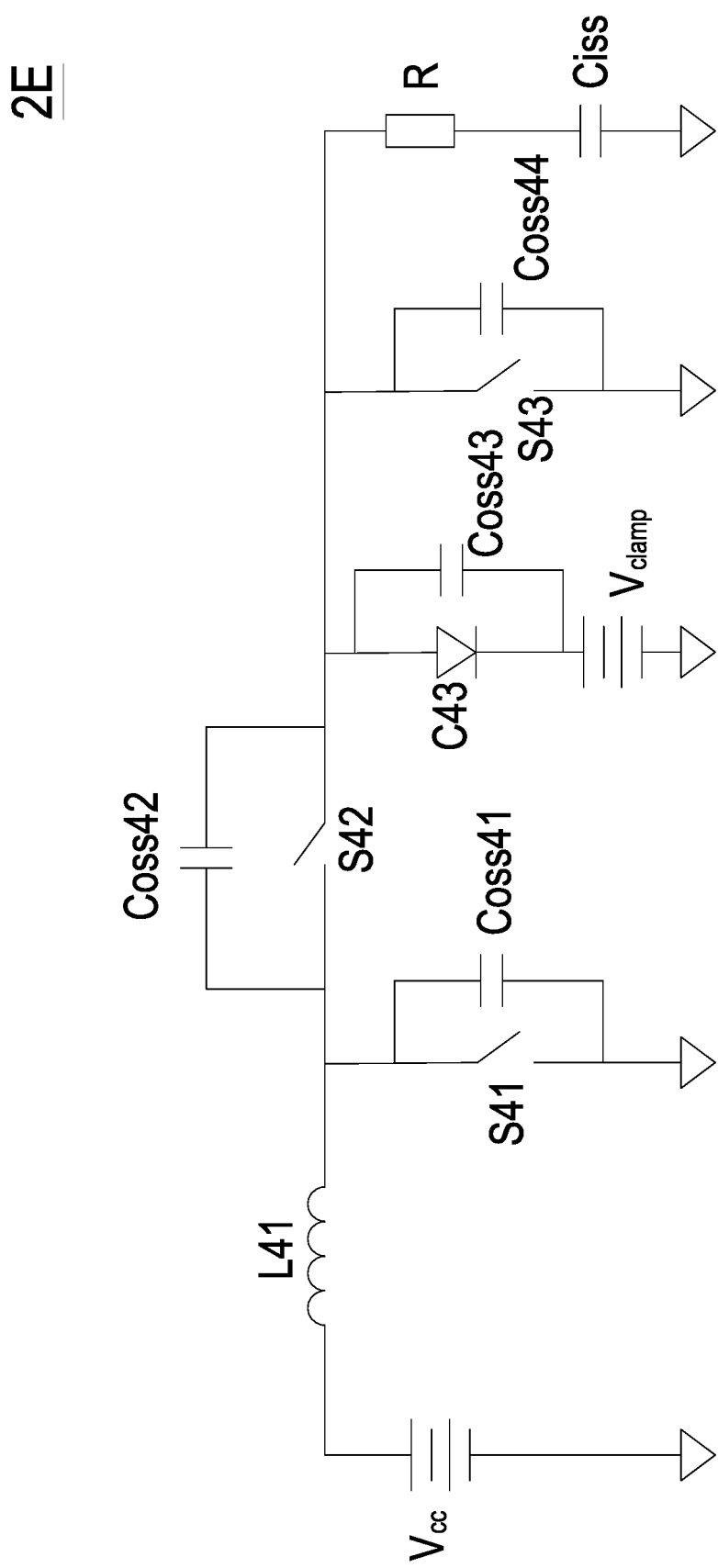
FIG. 29 is a schematic circuit diagram illustrating a driving circuit for a power switch according to an eleventh embodiment of the present invention.

FIG. 29 is a schematic circuit diagram illustrating a driving circuit for a power switch according to an eleventh embodiment of the present invention. Component parts and elements corresponding to those of the driving circuit of FIG. 26 are designated by identical numeral references, and detailed descriptions thereof are omitted. In comparison with the driving circuit 2C of FIG. 26, the driving circuit 2E of this embodiment further comprises a third driving switch S43. The third driving switch S43 has a fourth parasitic capacitor Coss44. The first terminal of the third driving switch S43 is electrically connected with the first terminal of the first clamping circuit C43, the second terminal of the second driving switch S42 and the first terminal of the resistor R. The second terminal of the third driving switch S43 is electrically connected with the ground terminal. In comparison with the driving circuit 2C of FIG. 26, the voltage of the input capacitor Ciss is not too high by the driving circuit 2E. Consequently, the possibility of causing damage of the power switch is reduced. The third driving switch S43 is turned on to control the discharging procedure of the input capacitor Ciss. Consequently, the input capacitor Ciss is discharged at a faster speed.

The driving circuit 2E is substantially equivalent to the equivalent circuit 2 of FIG. 9. However, the first equivalent capacitor Ci of this embodiment is related to the input capacitor Ciss of the power switch, the third parasitic capacitor Coss43 of the first clamping circuit C43 and the fourth parasitic capacitor Coss44 of the third driving switch S43.

As mentioned above, the first equivalent capacitor Ci is related to the input capacitor Ciss of the power switch, the third parasitic capacitor Coss43 of the first clamping circuit C43 and the fourth parasitic capacitor Coss44 of the third driving switch S43. Consequently, in the charging procedure of the first equivalent capacitor Ci, the relationships between Q1, Q2, Coss42, Coss43, Coss44, Ciss, Vclamp, Vcc, VH and Vo$_1$ satisfy the following formulae (28), (29) and (30):

$$Q1 = Coss42 \times (Vo_1 - Vcc) \qquad (31)$$

$$Q2 = (Ciss + Coss43 + Coss44) \times (Vclamp - VH) \qquad (32)$$

$$Q1 \le Q2 \qquad (33)$$

Figure 30:
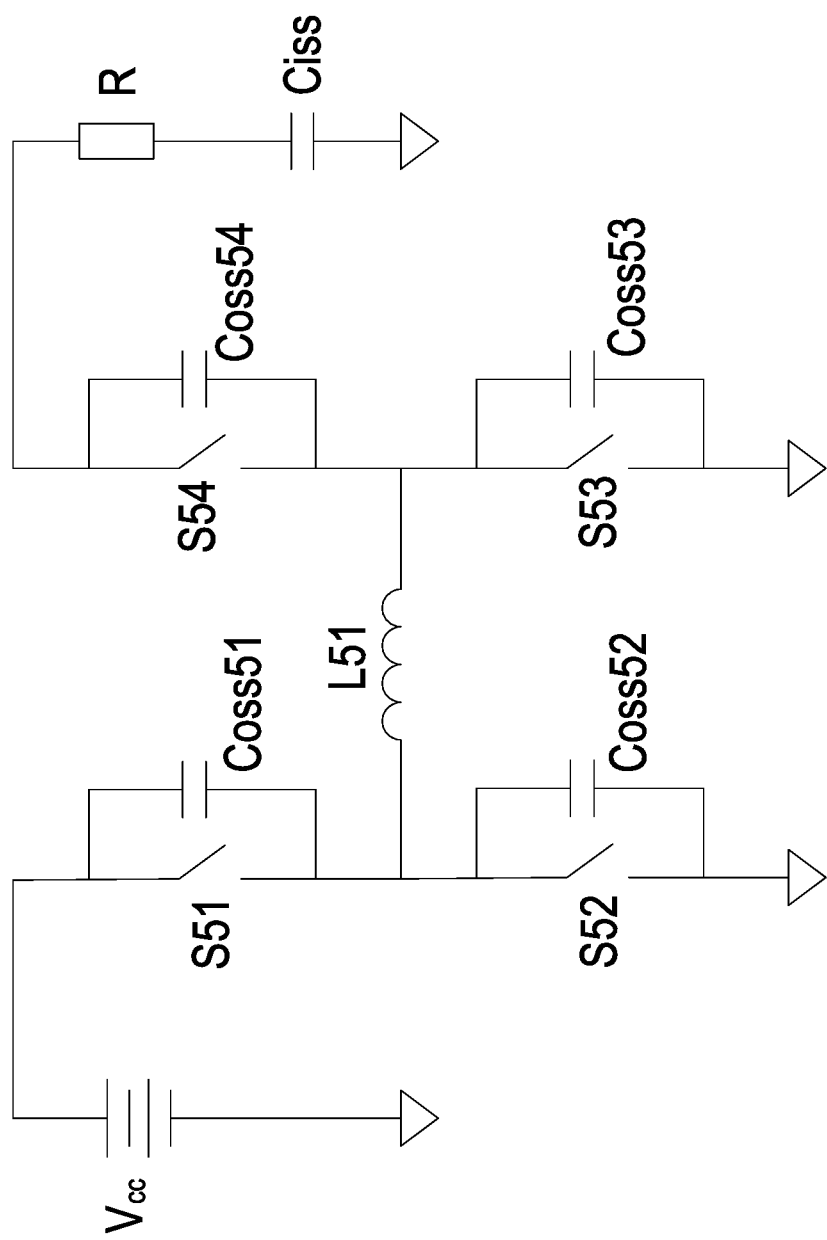
FIG. 30 is a schematic circuit diagram illustrating a driving circuit for a power switch according to a twelfth embodiment of the present invention.

FIG. 30 is a schematic circuit diagram illustrating a driving circuit for a power switch according to a twelfth embodiment of the present invention. As shown in FIG. 30, the driving circuit 3A comprises an inductor L51, a first driving switch S51, a second driving switch S52, a third driving switch S53, a fourth driving switch S54 and a resistor R. The capacitor Ciss is an input capacitor of the power switch (not shown). The first terminal of the first driving switch S51 is electrically connected with an input power source. The second terminal of the first driving switch S51 is electrically connected with the first terminal of the second driving switch S52 and the first terminal of the inductor L51. The second terminal of the second driving switch S52 is connected with a ground terminal. The first terminal of the fourth driving switch S54 is electrically connected with the first terminal of the resistor R. The second terminal of the fourth driving switch S54 is electrically connected with the second terminal of the inductor L51 and the first terminal of the third driving switch S53. The second terminal of the third driving switch S53 is connected with the ground terminal. The second terminal of the resistor R is electrically connected with the input capacitor Ciss. Moreover, the parasitic parameter of the first driving switch S51 is a first parasitic capacitor Coss51, the parasitic parameter of the second driving switch S52 is a second parasitic capacitor Coss52, the parasitic parameter of the third driving switch S53 is a third parasitic capacitor Coss53, and the parasitic parameter of the fourth driving switch S54 is a fourth parasitic capacitor Coss54.

The operations of charging and discharging the input capacitor Ciss will be described as follows. In this embodiment, the first driving switch S51, the second driving switch S52, the third driving switch S53 and the fourth driving switch S54 are selectively turned on or turned off to control the charging and discharging procedures of the input capacitor Ciss.

Figure 31:
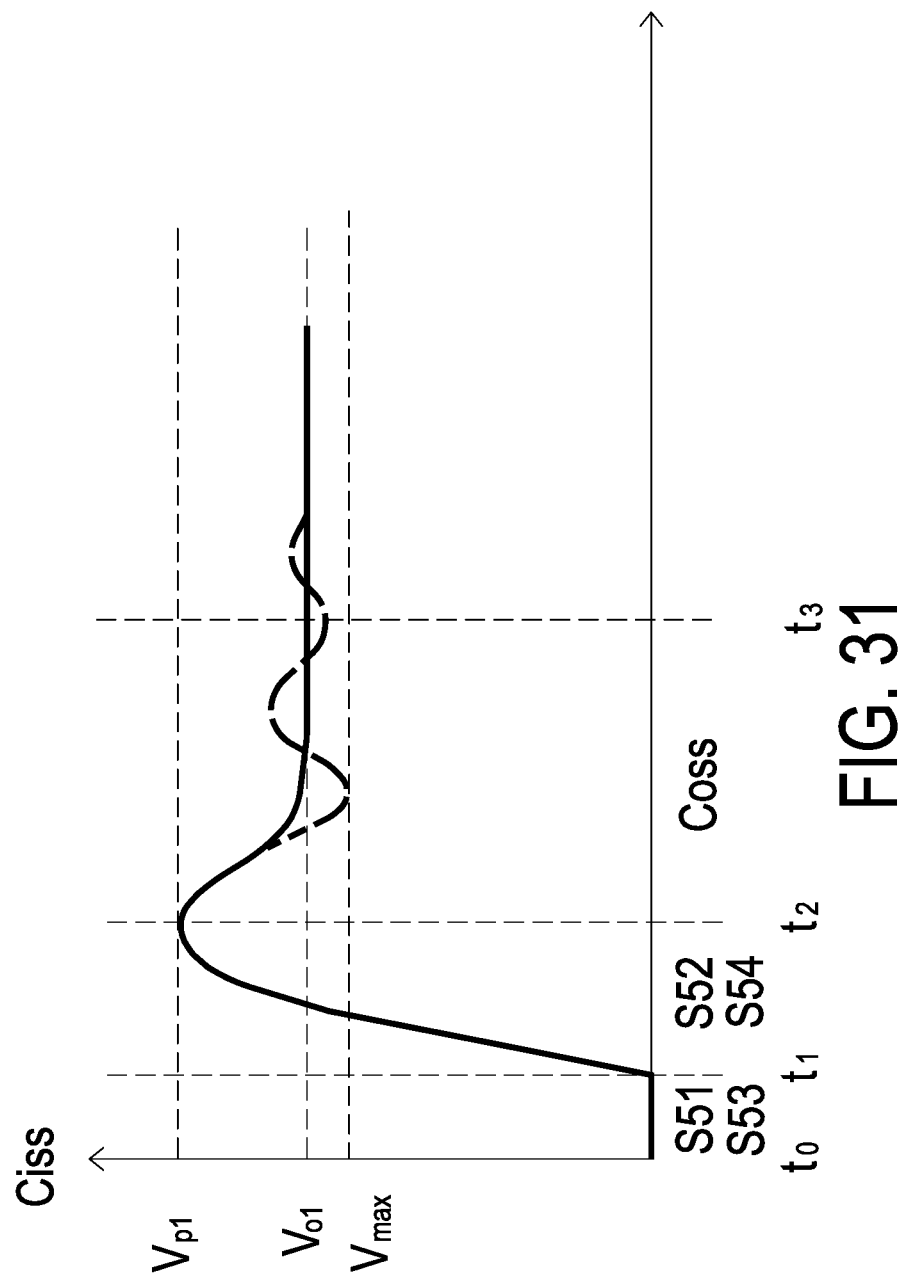
FIG. 31 is a schematic timing waveform diagram illustrating associated voltage signals of the driving circuit of FIG. 30 in the charging procedure of the input capacitor.

FIG. 31 is a schematic timing waveform diagram illustrating associated voltage signals of the driving circuit of FIG. 30 in the charging procedure of the input capacitor. In the time interval between t0 and t1, the first driving switch S51 and the third driving switch S53 are turned on. Consequently, the electric energy of the supply voltage Vcc of the input power source charges the inductor L51 through the first driving switch S51 and the third driving switch S53. At the time point t1, the first driving switch S51 and the third driving switch S53 are turned off, and the second driving switch S52 and the fourth driving switch S54 are turned on. Consequently, the input capacitor Ciss is charged by the current of the inductor L51 until the current of the inductor L51 is zero (i.e., at the time point t2). Meanwhile, the input capacitor Ciss is charged to the voltage Vp1. At the time point t2, the voltages of the first parasitic capacitor Coss51 and the third parasitic capacitor Coss53 are 0V, the voltage of the second parasitic capacitor Coss52 is Vcc, and the voltage of the fourth parasitic capacitor Coss54 is Vp1. Consequently, in the time interval between t2 and t3, the first parasitic capacitor Coss51 and the second parasitic capacitor Coss52 resonate with the input capacitor Ciss, the third parasitic capacitor Coss53 and the fourth parasitic capacitor Coss54 through the inductor L51. Due to the resonant oscillation, the voltage of the input capacitor Ciss gradually fluctuates from Vp1 to a first steady voltage Vo$_1$, the voltage of the second parasitic capacitor Coss52 gradually fluctuates to the voltage of the third parasitic capacitor Coss53. The input capacitor Ciss is connected in series with the fourth parasitic capacitor Coss54 of the fourth driving switch S54, and then connected in parallel with the third parasitic capacitor Coss53 of the third driving switch S53, and then connected in series with the first parasitic capacitor Coss51 of the first driving switch S51 and the second parasitic capacitor Coss52 of the second driving switch S52. Consequently, in the time interval between t2 and t3, the amount of charges discharged from the input capacitor Ciss (i.e., from Vp1 to Vo$_1$) plus the amount of charges discharged from the third parasitic capacitor Coss53 (i.e., in response to the voltage change) is Q1. Moreover, Q1 is equal to the change amount of charges in the first parasitic capacitor Coss51 while the voltage is changed from Vcc to the first steady voltage Vo$_1$ plus the change amount of charges in the second parasitic capacitor Coss52 while the voltage is changed from 0V to first steady voltage Vo$_1$. When the voltage of the input capacitor Ciss reaches the first steady voltage Vo$_1$, the first steady voltage Vo$_1$ must be higher than the first set voltage VH. Consequently, in the time interval between t2 and t3, the change amount of charges of the input capacitor Ciss from Vp1 to VH plus the change amount of charges of the third parasitic capacitor Coss53 is equal to Q2. Especially, Q2 is higher than or equal to Q1. That is, in the charging procedure of the input capacitor Ciss, the relationships between Q1, Q2, Coss51, Coss52, Coss53, Coss54, Ciss, Vp1, VH and Vo$_1$ satisfy the following formulae (34), (35) and (36):

$$Q1 = (Coss51 + Coss52) \times [VH - (Vp1 - Vo_1) \times (Ciss/Coss54)] \qquad (34)$$

$$Q2 = (Coss53 + Coss54) \times (Vp1 - VH) \times (Ciss/Coss54) + Coss53 \times (Vp1 - VH) \qquad (35)$$

$$Q1 \le Q2 \qquad (36)$$

In case that the first driving switch S51, the second driving switch S52, the third driving switch S53 and the fourth driving switch S54 are MOSFET with body diodes, the precision of controlling the second driving switch S52 and the fourth driving switch S54 may be reduced. After the charging procedure of the input capacitor Ciss is completed, the voltages of the second parasitic capacitor Coss52 and the third parasitic capacitor Coss53 in the steady state are lower than Vcc. In other words, $Vo_1-(Vp1-Vo_1)\times(Ciss/Coss54)<Vcc$. In the charging procedure of the input capacitor Ciss, the relationships between Q1, Q2, Coss51, Coss52, Coss53, Coss54, Ciss, Vp1, VH and $Vo_1$ satisfy the following formulae (37), (38) and (39):

$$Q1=(Coss51+Coss52)\times[Vo_1-(Vp1-Vo_1)\times(Ciss/Coss54)] \quad (37)$$

$$Q2=(Coss53+Coss54)\times(Vp1\times VH)\times(Ciss/Coss54)+Coss53\times(Vp1-VH) \quad (38)$$

$$Q1 \le Q2 \quad (39)$$

After the charging procedure of the input capacitor Ciss is completed, if the voltages of the second parasitic capacitor Coss52 and the third parasitic capacitor Coss53 in the steady state are clamped to Vcc by the body diode of the first driving switch S51, the relationships between Q1, Q2, Coss54, Ciss, Vp1 and VH satisfy the following formulae (40), (41) and (42):

$$Q1=Coss54\times(VH-Vcc) \quad (40)$$

$$Q2=Ciss\times(Vp1-VH) \quad (41)$$

$$Q1 \le Q2 \quad (42)$$

Figure 32:
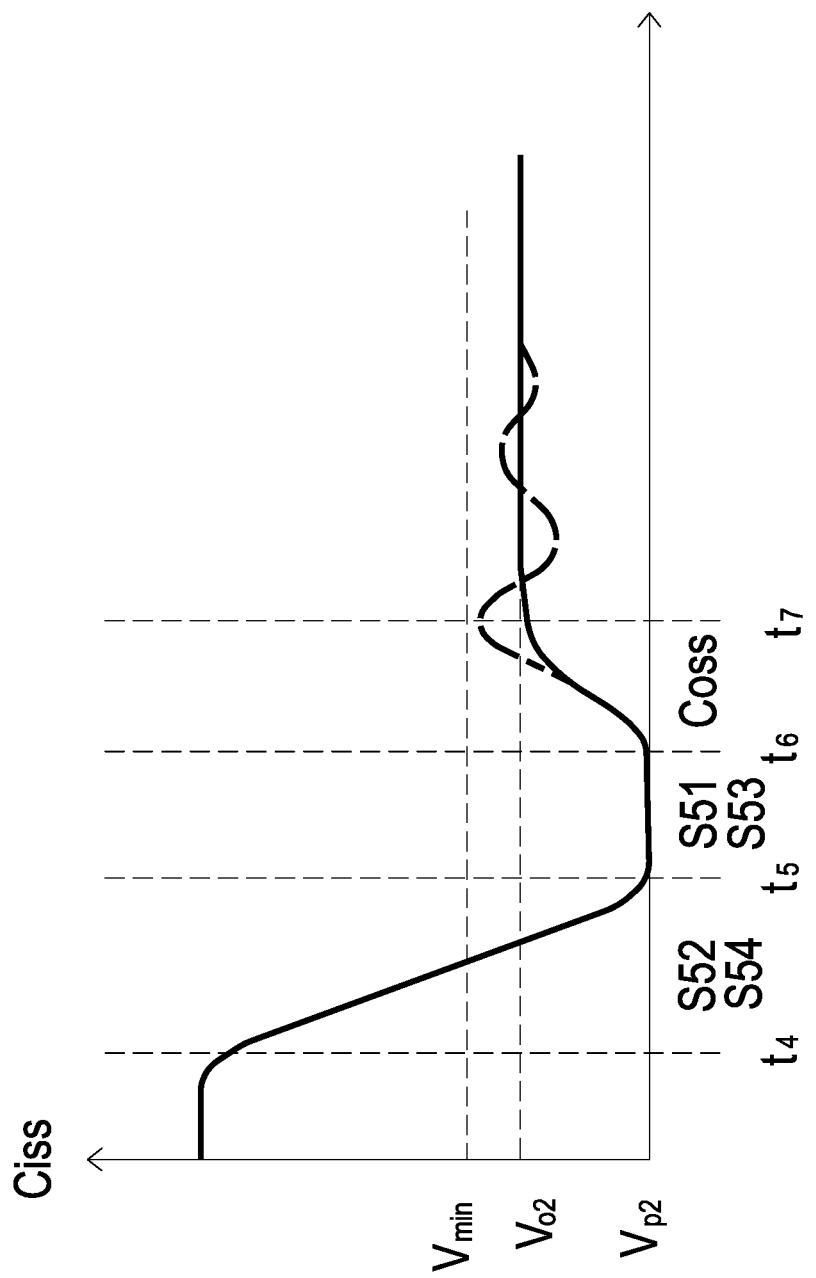
FIG. 32 is a schematic timing waveform diagram illustrating associated voltage signals of the driving circuit of FIG. 30 in the discharging procedure of the input capacitor.

FIG. 32 is a schematic timing waveform diagram illustrating associated voltage signals of the driving circuit of FIG. 30 in the discharging procedure of the input capacitor. Firstly, the second driving switch S52 and the fourth driving switch S54 are turned on in the time interval between t4 and t5. Consequently, the input capacitor Ciss discharges electricity, and the current flowing through the inductor L51 increases. At the time point t5 when the voltage of the input capacitor Ciss reaches Vp2, the second driving switch S52 and the fourth driving switch S54 are turned off, and the first driving switch S51 and the third driving switch S53 are turned on. Consequently, the input capacitor Ciss discharges electricity to the input power source through the inductor L51, and the current of the inductor L51 gradually decreases until the current of the inductor L51 is zero (i.e., at the time point t6). Meanwhile, the first driving switch S51 and the third driving switch S53 are turned off. At the time point t6, the first parasitic capacitor Coss51 is discharged to 0V, and the voltage of the second parasitic capacitor Coss52 is Vcc. Consequently, in the time interval between t6 and t7, the first parasitic capacitor Coss51 and the second parasitic capacitor Coss52 resonate with the input capacitor Ciss, the third parasitic capacitor Coss53 and the fourth parasitic capacitor Coss54 through the inductor L51. Due to the resonant oscillation, the voltage of the input capacitor Ciss gradually fluctuates from Vp2 to a second steady voltage $Vo_2$, and the voltage of the second parasitic capacitor Coss32 gradually fluctuates to the voltage of the third parasitic capacitor Coss53. The input capacitor Ciss is connected in series with the fourth parasitic capacitor Coss54 of the fourth driving switch S54, and then connected in parallel with the third parasitic capacitor Coss53 of the third driving switch S53, and then connected in series with the first parasitic capacitor Coss51 of the first driving switch S51 and the second parasitic capacitor Coss52 of the second driving switch S52. Consequently, in the time interval between t6 and t7, the amount of charges charged into the input capacitor Ciss (i.e., from Vp2 to $Vo_2$) is Q3. Moreover, Q3 is equal to the change amount of charges in the first parasitic capacitor Coss51 while the voltage is changed from 0V to second steady voltage $Vo_2$ plus the change amount of charges in the second parasitic capacitor Coss52 while the voltage is changed from Vcc to the second steady voltage $Vo_2$. When the voltage of the input capacitor Ciss reaches the second steady voltage $Vo_2$, the second steady voltage $Vo_2$ must be lower than the second set voltage VL. Consequently, in the time interval between t6 and t7, the change amount of charges of the input capacitor Ciss from Vp2 to VL plus the change amount of charges of the third parasitic capacitor Coss53 is equal to Q4. Especially, Q4 is higher than or equal to Q3. That is, in the discharging procedure of the input capacitor Ciss, the relationships between Q3, Q4, Coss51, Coss52, Coss53, Coss54, Ciss, Vp2, VL, Vcc and $Vo_2$ satisfy the following formulae (43), (44) and (45)

$$Q3=(Coss51+Coss52)\times[Vcc-(Vo_2-Vp2)\times(Ciss/Coss54)] \quad (43)$$

$$Q4=(Coss53+Coss54)\times(VL-Vp2)\times(Ciss/Coss54)+Coss53\times(VL-Vp2) \quad (44)$$

$$Q3 \le Q4 \quad (45)$$

Preferably, the voltage Vp2 is 0V. If the on duration of the second driving switch S52 or the fourth driving switch S54 is too long, the input capacitor Ciss is inversely charged. Under this circumstance, the voltage Vp2 is lower than 0V, the oscillation extent of the voltage of the input capacitor Ciss is too large, and the energy loss increases.

In case that the first driving switch S51, the second driving switch S52, the third driving switch S53 and the fourth driving switch S54 are MOSFET with body diodes, the precision of controlling the first driving switch S51 and the third driving switch S53 may be reduced. After the discharging procedure of the input capacitor Ciss is completed, the voltages of the second parasitic capacitor Coss52 and the third parasitic capacitor Coss53 are lower than the second steady voltage $Vo_2$ of the input capacitor Ciss. In other words, $(Vo_2-Vp2)\times(1+Ciss/Coss54)<Vo_2$. In the discharging procedure of the input capacitor Ciss, the relationships between Q3, Q4, Coss51, Coss52, Coss53, Coss54, Ciss, Vp2, VL and $Vo_2$ satisfy the following formulae (46), (47) and (48):

$$Q3=(Coss51+Coss52)\times[Vcc-(Vo_2-Vp2)\times(Ciss/Coss54)] \quad (46)$$

$$Q4=(Coss53+Coss54)\times(VL-Vp2)\times(Ciss/Coss54)+Coss53\times(VL-Vp2) \quad (47)$$

$$Q3 \le Q4 \quad (48)$$

After the discharging procedure of the input capacitor Ciss is completed, if the voltages of the second parasitic capacitor Coss52 and the third parasitic capacitor Coss53 are clamped to $Vo_2$ by the body diode of the fourth driving switch S54, the relationships between Q3, Q4, Coss51, Coss52, Ciss, Vp2, VL and Vcc satisfy the following formulae (49), (50) and (51):

$$Q3=(Coss51+Coss52)\times(Vcc-VL) \quad (49)$$

$$Q4=Ciss\times(VL-Vp2) \quad (50)$$

$$Q3 \le Q4 \quad (51)$$

The driving circuit 3A is substantially equivalent to the equivalent circuit 2 of FIG. 9. However, the first equivalent capacitor Ci of this embodiment is related to the input capacitor Ciss of the power switch, the third parasitic capacitor Coss53 of the first clamping circuit C53 and the fourth parasitic capacitor Coss54 of the third driving switch S54. The equivalent inductor L comprises the inductor L51 of the driving circuit 3A. The second equivalent capacitor Coss is related to the first parasitic capacitor Coss51 of the first driving circuit S51 and the second parasitic capacitor Coss52 of the second driving circuit S52.

Figure 33:
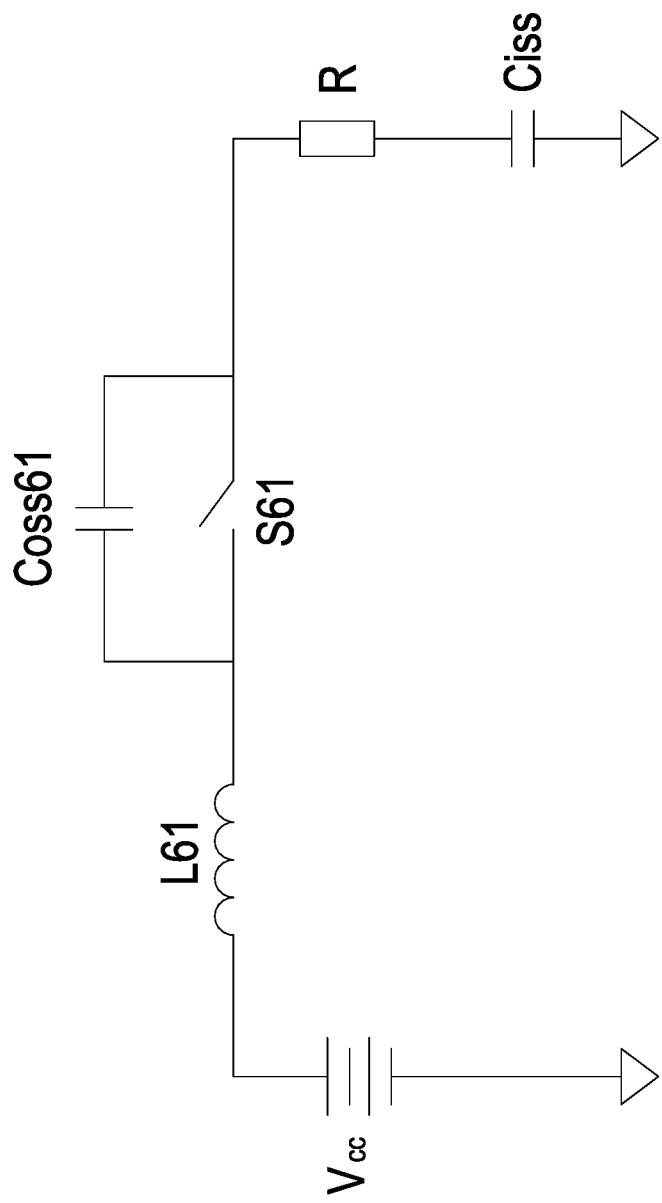
FIG. 33 is a schematic circuit diagram illustrating a driving circuit for a power switch according to a thirteenth embodiment of the present invention.

FIG. 33 is a schematic circuit diagram illustrating a driving circuit for a power switch according to a thirteenth embodiment of the present invention. As shown in FIG. 33, the driving circuit 4A comprises an inductor L61, a first driving switch S61 and a resistor R. The capacitor Ciss is an input capacitor of the power switch (not shown). The first terminal of the first driving switch S61 is electrically connected with the second terminal of the inductor L61. The second terminal of the first driving switch S31 is electrically connected with the first terminal of the resistor R. The first terminal of the inductor L61 is electrically connected with an input power source. The second terminal of the resistor R is electrically connected with the input capacitor Ciss. Moreover, the parasitic parameter of the first driving switch S61 is a parasitic capacitor Coss61.

The operations of charging and discharging the input capacitor Ciss will be described as follows. In this embodiment, the first driving switch S61 is selectively turned on or turned off to control the charging and discharging procedures of the input capacitor Ciss.

Figure 34:
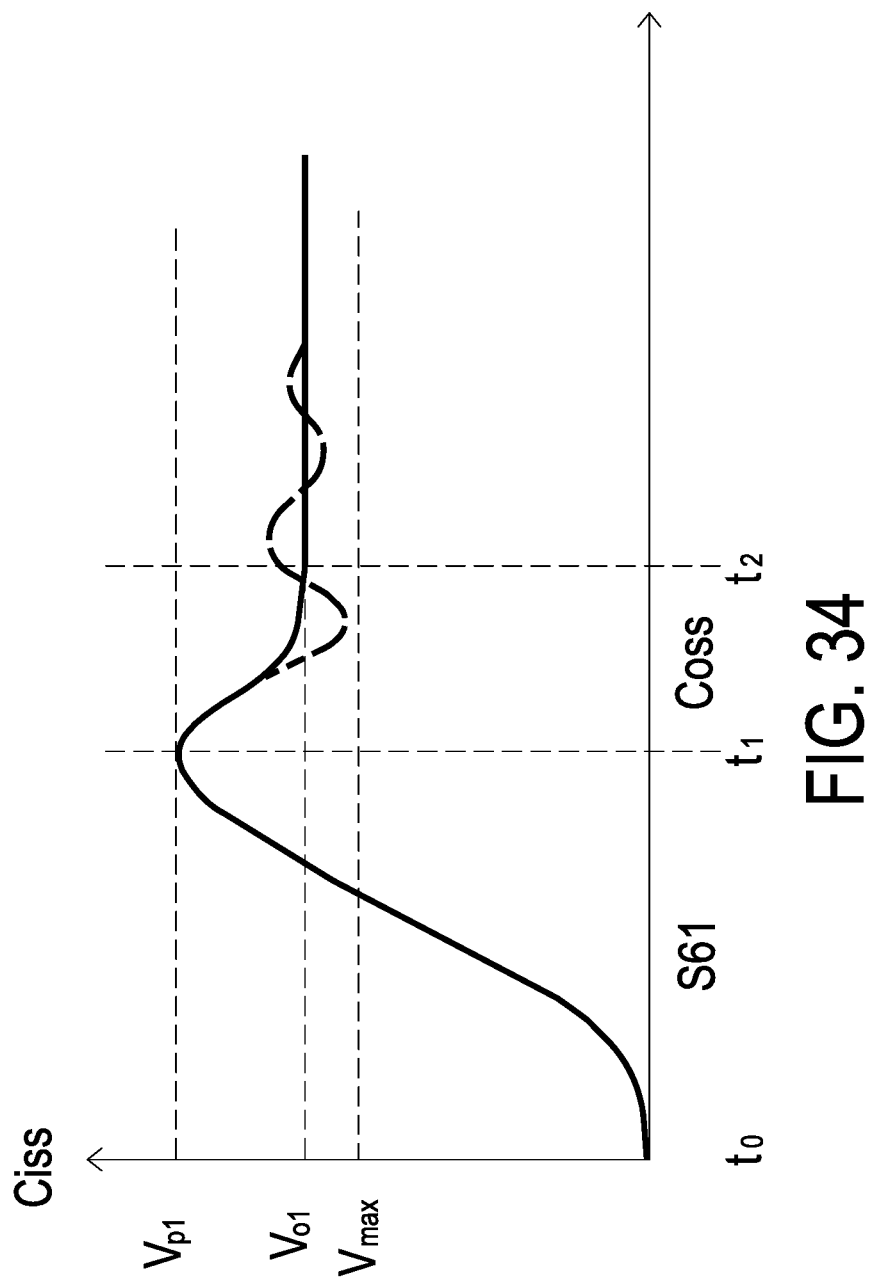
FIG. 34 is a schematic timing waveform diagram illustrating associated voltage signals of the driving circuit of FIG. 33 in the charging procedure of the input capacitor.

FIG. 34 is a schematic timing waveform diagram illustrating associated voltage signals of the driving circuit of FIG. 33 in the charging procedure of the input capacitor. Firstly, the first driving switch S61 is turned on in the time interval between t0 and t1. Consequently, the electric energy of the supply voltage Vcc of the input power source charges the input capacitor Ciss through the first driving switch S61. The current flowing through the inductor L61 increases and then gradually decreases. At the time point t1, the first driving switch S31 is turned off, and the current of the inductor L61 decreases to zero. Meanwhile, the input capacitor Ciss is charged to the voltage Vp1. The voltage Vp1 is higher than the supply voltage Vcc but lower than or equal to 2×Vcc. In the time interval between t1 and t2, the first parasitic capacitor Coss61 resonates with the input capacitor Ciss through the inductor L61. Due to the resonant oscillation, the voltage of the input capacitor Ciss gradually fluctuates from Vp1 to a first steady voltage Vo$_1$, and the the parasitic capacitor Coss61 fluctuates until the sum of the voltage of the parasitic capacitor Coss61 and the supply voltage Vcc is equal to the voltage of the input capacitor Ciss. The input capacitor Ciss is serially connected with the parasitic capacitor Coss61 of the first driving switch S61. Consequently, in the time interval between t1 and t2, the amount of charges discharged from the input capacitor Ciss (i.e., from Vp1 to Vo$_1$) is Q1. Moreover, Q1 is equal to the change amount of charges in first parasitic capacitor Coss61 while the voltage is changed from 0V to (Vo$_1$-Vcc). When the voltage of the input capacitor Ciss reaches the first steady voltage Vo$_1$, the first steady voltage Vo$_1$ must be higher than the first set voltage VH. Consequently, in the time interval between t1 and t2, the change amount of charges of the input capacitor Ciss from Vp1 to VH is equal to Q2. Especially, Q2 is higher than or equal to Q1. That is, in the charging procedure of the input capacitor Ciss, the relationships between Q1, Q2, Coss42, Ciss, Vp1, VH and Vo$_1$ satisfy the following formulae (52), (53) and (54):

$$Q1 = Coss61 \times (Vo_1 - Vcc) \quad (52)$$

$$Q2 = Ciss \times (Vp1 - VH) \quad (53)$$

$$Q1 \leq Q2 \quad (54)$$

Figure 35:
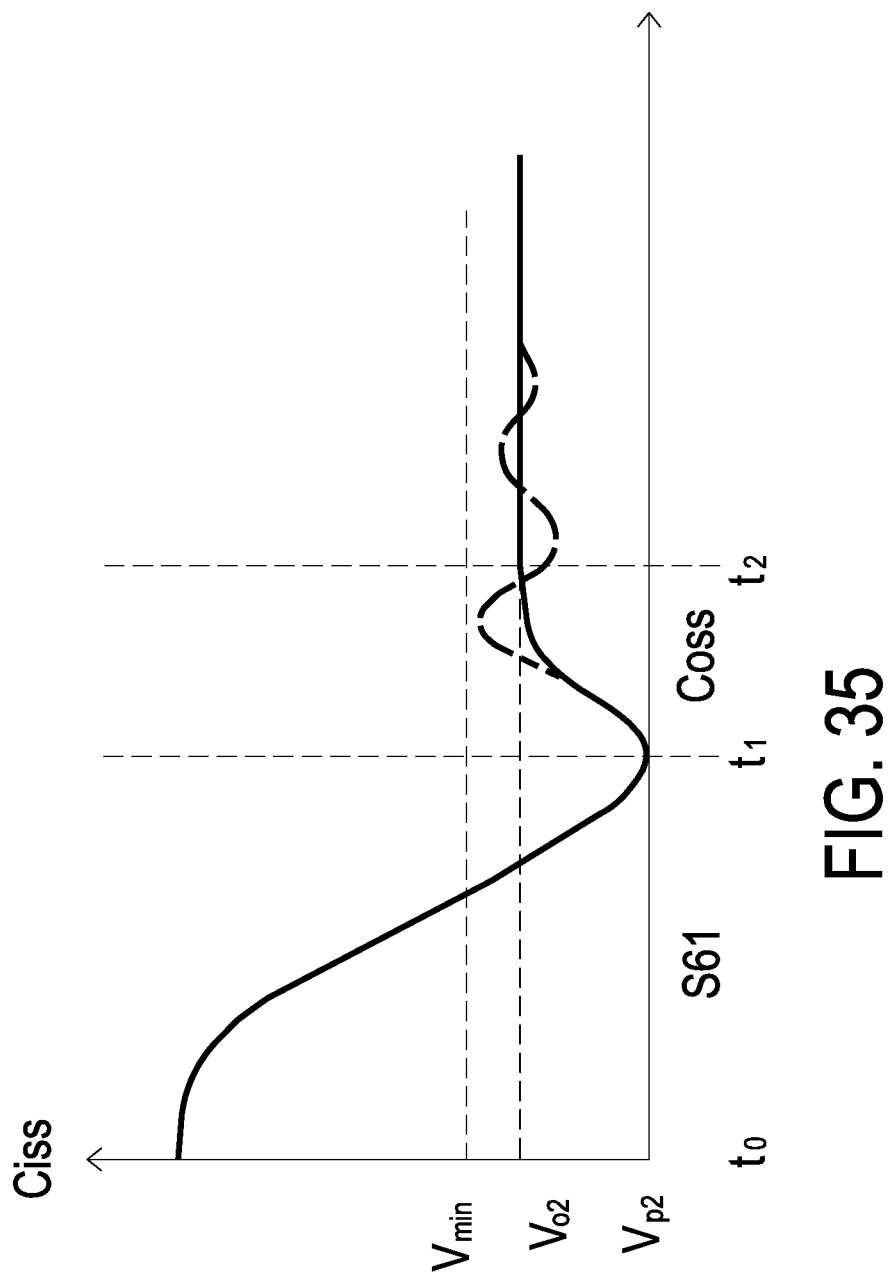
FIG. 35 is a schematic timing waveform diagram illustrating associated voltage signals of the driving circuit of FIG. 33 in the discharging procedure of the input capacitor.

FIG. 35 is a schematic timing waveform diagram illustrating associated voltage signals of the driving circuit of FIG. 33 in the discharging procedure of the input capacitor. Firstly, the first driving switch S61 is turned on in the time interval between t0 and t1. Consequently, the input capacitor Ciss discharges electricity, and the current flowing through the inductor L61 increases and then gradually decreases. At the time point t1 when the voltage of the input capacitor Ciss reaches the voltage Vp2 and the current of the inductor L61 decreases to zero, the first driving switch S61 is turned off. At the time point t1, the voltage of the input capacitor Ciss is Vp2. Preferably, the voltage Vp2 is 0V, and the voltage of the input capacitor Ciss is 0V. Consequently, in the time interval between t1 and t2, the first parasitic capacitor Coss61 resonates with the input capacitor Ciss through the inductor L61. Due to the resonant oscillation, the voltage of the input capacitor Ciss gradually fluctuates from Vp2 to a second steady voltage Vo$_2$, and the voltage of the parasitic capacitor Coss61 gradually fluctuates to the voltage (Vcc−Vo$_2$). The input capacitor Ciss is serially connected with the parasitic capacitor Coss361 of the first driving switch S61. Consequently, in the time interval between t1 and t2, the amount of charges charged into the input capacitor Ciss (i.e., from Vp2 to Vo$_2$) is Q3. Moreover, Q3 is equal to the change amount of charges in the parasitic capacitor Coss61 while the voltage is changed from 0V to (Vcc−Vo$_2$). When the voltage of the input capacitor Ciss reaches the second steady voltage Vo$_2$, the second steady voltage Vo$_2$ must be lower than the second set voltage VL. Consequently, in the time interval between t1 and t2, the change amount of charges of the input capacitor Ciss from Vp2 to VL is equal to Q4. Especially, Q4 is higher than or equal to Q3. That is, in the discharging procedure of the input capacitor Ciss, the relationships between Q3, Q4, Coss61, Ciss, Vp2, VL, Vcc and Vo$_2$ satisfy the following formulae (55), (56) and (57)

$$Q3 = Coss61 \times (Vcc - Vo_2) \quad (55)$$

$$Q4 = Ciss \times (Vp2 - VL) \quad (56)$$

$$Q3 \leq Q4 \quad (57)$$

The driving circuit 4A is substantially equivalent to the equivalent circuit 2 of FIG. 9. However, the first equivalent capacitor Ci of this embodiment is related to the input capacitor Ciss of the power switch. The equivalent inductor L comprises the inductor L61 of the driving circuit 4A. The second equivalent capacitor Coss is related to the parasitic capacitor Coss61 of the first driving circuit S61.

From the above descriptions, the present invention provides a driving circuit for a power switch. The inductor of the driving circuit does not need to provide the constant current. Under this circumstance, smaller inductance of the inductor may be required, and thus the volume of the inductor may be reduced. Moreover, the energy loss of the driving circuit may be reduced when compared with the conventional driving circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit for driving a power switch comprising an input capacitor, the driving circuit comprising:
an inductor;
a resistor comprising a parasitic resistor of the driving circuit; and
a first driving switch and a second driving switch electrically connected with the inductor, wherein the first driving switch and the second driving switch are electrically connected with each other and electrically connected with the inductor, wherein the first driving switch comprises a first parasitic capacitor and the second driving switch comprises a second parasitic capacitor,
wherein the driving circuit is configured such that a first equivalent capacitor is formed corresponding to the input capacitor, and a second equivalent capacitor is formed corresponding to one or both of the first and second parasitic capacitors,
wherein the first equivalent capacitor, the inductor, the resistor and the second equivalent capacitor are serially connected with each other to form an equivalent circuit to charge the input capacitor of the power switch, and a charging procedure of the input capacitor is performed through the equivalent circuit,
wherein during the charging procedure, firstly, the first driving switch and the second driving switch are turned on by turns, which causes a voltage of the input capacitor to increase to a maximum voltage $Vp_1$, and there is substantially no inductor current when the voltage of the input capacitor is at the maximum voltage $Vp_1$, then, the first driving switch and the second driving switch are turned off, which causes the voltage of the input capacitor to decrease from the maximum voltage to a first steady voltage,
wherein the first and second equivalent capacitors are configured such that:
(1) during the charging procedure, while the voltage of the input capacitor is changed from the maximum voltage $Vp_1$ to the first steady voltage, a first amount of charges discharged from the input capacitor is equal to Q1, whereas while the voltage of the input capacitor is changed from the maximum voltage $Vp_1$ to a first set voltage VH, a second amount of charges discharged from the input capacitor is equal to Q2, wherein Q2 is greater than or equal to Q1, and
(2) the first steady voltage is higher than the first set voltage VH, and the first set voltage VH is higher than a maximum threshold Vmax of a gate terminal of the power switch.

2. The driving circuit according to claim 1, wherein a first terminal of the first driving switch is electrically connected with an input power source, a second terminal of the first driving switch is electrically connected with a first terminal of the second driving switch and a first terminal of the inductor, a second terminal of the second driving switch is connected with a ground terminal, a second terminal of the inductor is electrically connected with a first terminal of the resistor, and a second terminal of the resistor is electrically connected with the input capacitor.

3. The driving circuit according to claim 2, wherein the first equivalent capacitor is formed corresponding to the input capacitor and the second equivalent capacitor is formed corresponding to the first parasitic capacitor and the second parasitic capacitor, such that:

$$Q1 = Coss31 \times Vo_1 + Coss32 \times Vo_1$$

$$Q2 = Ciss \times (Vp_1 - VH)$$

where Coss31 is a capacitance of the first parasitic capacitor, Coss32 is a capacitance of the second parasitic capacitor, Ciss is a capacitance of the input capacitor, $Vo_1$ is the first steady voltage, and Vcc is a voltage of the input power source.

4. The driving circuit according to claim 2, wherein the driving circuit further comprises a first clamping circuit and a second clamping circuit, the first clamping circuit comprises a third parasitic capacitor, and the second clamping circuit comprises a fourth parasitic capacitor, wherein a first terminal of the first clamping circuit is connected with the first terminal of the first driving switch and the input power source, a second terminal of the first clamping circuit is connected with the second terminal of the inductor, a first terminal of the second clamping circuit and the first terminal of the resistor, and a second terminal of the second clamping circuit is connected with the ground terminal, wherein when the voltage of the input capacitor is higher than an over-voltage value, the voltage of the input capacitor is clamped to the over-voltage value by the first clamping circuit, wherein when the voltage of the input capacitor is lower than an under-voltage value, the voltage of the input capacitor is clamped to the under-voltage value by the second clamping circuit.

5. The driving circuit according to claim 4, wherein the first equivalent capacitor is formed corresponding to the input capacitor, the third parasitic capacitor and the fourth parasitic capacitor, the second equivalent capacitor is formed corresponding to the first parasitic capacitor and the second parasitic capacitor, such that:

$$Q1 = (Coss31 + Coss32) \times Vo_1$$

$$Q2 = (Ciss + Coss34 + Coss35) \times (Vp_1 - VH)$$

where Coss31 is a capacitance of the first parasitic capacitor, Coss32 is a capacitance of the second parasitic capacitor, Ciss is a capacitance of the input capacitor, Coss35 is a capacitance of the third parasitic capacitor of the first clamping circuit, $Vo_1$ is the first steady voltage, and Coss34 is a capacitance of the fourth parasitic capacitor of the second clamping circuit.

6. The driving circuit according to claim 2, wherein the driving circuit further comprises a third driving switch, and the third driving switch has a third parasitic capacitor, wherein a first terminal of the third driving switch is electrically connected with the second terminal of the inductor and the first terminal of the resistor, a second terminal of the third driving switch is electrically connected with the ground terminal, wherein the driving circuit turns on the third driving switch to discharge the input capacitor.

7. The driving circuit according to claim 6, wherein the first equivalent capacitor is formed corresponding to the input capacitor and the third parasitic capacitor, the second equivalent capacitor is formed corresponding to the first parasitic capacitor and the second parasitic capacitor, such that:

$$Q1 = (Coss31 + Coss32) \times Vo_1$$

$$Q2 = (Ciss + Coss33) \times (Vp_1 - VH)$$

where Coss31 is a capacitance of the first parasitic capacitor, Coss32 is a capacitance of the second parasitic capacitor, Ciss is a capacitance of the input capacitor, $Vo_1$ is the first steady voltage, and Coss33 is a capacitance of the third parasitic capacitor.

8. The driving circuit according to claim 6, wherein the driving circuit further comprises a first clamping circuit having a fourth parasitic capacitor, wherein a first terminal of the first clamping circuit is connected with the first terminal of the first driving switch and the input power source, a second terminal of the first clamping circuit is connected with the second terminal of the inductor, and a first terminal of the third driving switch and the first terminal of the resistor, wherein when the voltage of the input capacitor is higher than an over-voltage value, the voltage of the input capacitor is clamped to the over-voltage value by the first clamping circuit.

9. The driving circuit according to claim 8, wherein the first equivalent capacitor is formed corresponding to the input capacitor, the third parasitic capacitor and the fourth parasitic capacitor, the second equivalent capacitor is formed corresponding to the first parasitic capacitor and the second parasitic capacitor, such that:

$Q1 = (Coss31 + Coss32) \times Vo_1$ $Q2 = (Ciss + Coss33 + Coss35) \times (Vp_1 - VH)$ where Coss31 is a capacitance of the first parasitic capacitor, Coss32 is a capacitance of the second parasitic capacitor, Ciss is a capacitance of the input capacitor, Coss35 is a capacitance of the fourth parasitic capacitor of the first clamping circuit, $Vo_1$ is the first steady voltage, and Coss33 is a capacitance of the third parasitic capacitor.

10. The driving circuit according to claim 1, wherein a first terminal of the inductor is electrically connected with an input power source, a second terminal of the inductor is electrically connected with a first terminal of the first driving switch and a first terminal of the second driving switch, a second terminal of the second driving switch is electrically connected with a first terminal of the resistor, and a second terminal of the resistor is electrically connected with the input capacitor, and a second terminal of the first driving switch is electrically connected with a ground terminal.

11. The driving circuit according to claim 10, wherein the first equivalent capacitor is formed corresponding to the input capacitor and the second equivalent capacitor is formed corresponding to the second parasitic capacitor, such that:

$Q1 = Coss42 \times (Vo_1 - Vcc)$ $Q2 = Ciss \times (Vp_1 - VH)$ where Coss42 is a capacitance of the second parasitic capacitor of the second driving switch, Ciss is a capacitance of the input capacitor, $Vo_1$ is the first steady voltage, and Vcc is a voltage of the input power source.

12. The driving circuit according to claim 10, wherein the driving circuit further comprises a first clamping circuit and a DC clamping power source, and the first clamping circuit has a third parasitic capacitor, wherein a first terminal of the first clamping circuit is electrically connected with the second terminal of the second driving switch and the first terminal of the resistor, and the DC clamping power source is connected between a second terminal of the first clamping circuit and the ground terminal, wherein when the voltage of the input capacitor is higher than a voltage of the DC clamping power source, the voltage of the input capacitor is clamped to the voltage of the DC clamping power source by the first clamping circuit.

13. The driving circuit according to claim 12, wherein the first equivalent capacitor is formed corresponding to the input capacitor and the third parasitic capacitor, the second parasitic capacitor is formed corresponding to the second parasitic capacitor, such that:

$Q1 = Coss42 \times (Vo_1 - Vcc)$ $Q2 = (Ciss + Coss43) \times (Vclamp - VH)$ where Coss42 is a capacitance of the second parasitic capacitor of the second driving switch, Ciss is a capacitance of the input capacitor, Coss43 is a capacitance of the third parasitic capacitor, $Vo_1$ is the first steady voltage, Vcc is a voltage of the input power source, and Vclamp is equal to the maximum voltage $Vp_1$.

14. The driving circuit according to claim 12, wherein the driving circuit further comprises a third driving switch, and the third driving switch has a fourth parasitic capacitor, wherein a first terminal of the third driving switch is electrically connected with the first terminal of the first clamping circuit, the second terminal of the second driving switch and the first terminal of the resistor, and a second terminal of the third driving switch is electrically connected with the ground terminal, wherein the driving circuit turns on the third driving switch to discharge the input capacitor.

15. The driving circuit according to claim 14, wherein the first equivalent capacitor is formed corresponding to the input capacitor, the third parasitic capacitor and the fourth parasitic capacitor, the second parasitic capacitor is formed corresponding to the second parasitic capacitor of the second driving circuit, such that:

$Q1 = Coss42 \times (Vo_1 - Vcc)$ $Q2 = (Ciss + Coss43 + Coss44) \times (Vclamp - VH)$ where Coss42 is a capacitance of the second parasitic capacitor of the second driving switch, Ciss is a capacitance of the input capacitor, Coss43 is a capacitance of the third parasitic capacitor, Coss44 is a capacitance of the fourth parasitic capacitor, $Vo_1$ is the first steady voltage, Vcc is a voltage of the input power source, and Vclamp is equal to the maximum voltage $Vp_1$.

16. The driving circuit according to claim 10, wherein the driving circuit further comprises a third driving switch, and the third driving switch has a third parasitic capacitor, wherein a first terminal of the third driving switch is electrically connected with the second terminal of the second driving switch and the first terminal of the resistor, and a second terminal of the third driving switch is electrically connected with the ground terminal, wherein the third driving switch is turned on to discharge the input capacitor.

17. The driving circuit according to claim 16, wherein the first equivalent capacitor is formed corresponding to the input capacitor and the third parasitic capacitor, the second parasitic capacitor is formed corresponding to the second parasitic capacitor, such that:

$Q1 = Coss42 \times (Vo_1 - Vcc)$ $Q2 = (Ciss + Coss43) \times (Vclamp - VH)$ where Coss42 is a capacitance of the second parasitic capacitor of the second driving switch, Ciss is a capacitance of the input capacitor, Coss43 is a capacitance of the third parasitic capacitor, $Vo_1$ is the first steady voltage, Vcc is a voltage of the input power source, and Vclamp is equal to equal to the maximum voltage $Vp_1$.

18. The driving circuit according to claim 1, further comprising a third driving switch and a fourth driving switch, wherein a first terminal of the first driving switch is electrically connected with an input power source, a second terminal of the first driving switch is electrically connected with a first terminal of the second driving switch and a first terminal of the inductor, a second terminal of the second driving switch is connected with a ground terminal, a first terminal of the fourth driving switch is electrically connected with a first terminal of the resistor, a second terminal of the fourth driving switch is electrically connected with a second terminal of the inductor and a first terminal of the third driving switch, a second terminal of the third driving switch is connected with the ground terminal, and a second terminal of the resistor is electrically connected with the input capacitor, wherein the driving circuit selectively turns on or turns off the first driving switch, the second driving switch, the third driving switch and the fourth driving switch to control the charging procedure of the input capacitor.

19. The driving circuit according to claim 18, wherein the first equivalent capacitor is formed corresponding to the input capacitor, a third parasitic capacitor of the third driving switch and a fourth parasitic capacitor of the fourth driving switch, the second equivalent capacitor is formed corresponding to the first parasitic capacitor and the second parasitic capacitor, such that:

$$Q1=(Coss51+Coss52)\times[VH-(Vp_1-Vo_1)\times(Ciss/Coss54)]$$

$$Q2=(Coss53+Coss54)\times(Vp_1-VH)\times(Ciss/Coss54)+Coss53\times(Vp_1-VH)$$

where $Vo_1$ is the first steady voltage, Coss51 is a capacitance of the first parasitic capacitor of the first driving switch, Coss52 is a capacitance of the second parasitic capacitor of the second driving switch, Ciss is a capacitance of the input capacitor, Coss53 is a capacitance of the third parasitic capacitor of the third driving switch, and Coss54 is a capacitance of the fourth parasitic capacitor of the fourth driving switch.

20. The driving circuit according to claim 1, wherein the resistor has a resistance causing the first steady voltage to be higher than 0.5×(Vp1+Vmax).

21. The driving circuit according to claim 1, wherein, during the charging procedure, the first driving switch is turned on while the second driving switch is turned off and then the first driving switch is turned off while the second driving switch is turned on to thereby cause the voltage of the input capacitor to increase to the maximum voltage $Vp_1$.

22. A driving circuit for driving a power switch comprising an input capacitor, the driving circuit comprising:
an inductor;
a resistor comprising a parasitic resistor of the driving circuit; and
a first driving switch and a second driving switch electrically connected with the inductor, wherein the first driving switch and the second driving switch are electrically connected with each other and electrically connected with the inductor, wherein the first driving switch comprises a first parasitic capacitor and the second driving switch comprises a second parasitic capacitor,
wherein the driving circuit is configured such that a first equivalent capacitor is formed corresponding to the input capacitor, and a second equivalent capacitor is formed corresponding to one or both of the first and second parasitic capacitors,
wherein the first equivalent capacitor, the inductor, the resistor and the second equivalent capacitor are serially connected with each other to form an equivalent circuit to discharge the input capacitor of the power switch, and a discharging procedure of the input capacitor is performed through the equivalent circuit,
wherein during the discharging procedure, firstly, the first driving switch and the second driving switch are turned on by turns, which causes the voltage of the input capacitor to decrease to a minimum voltage $Vp_2$, and there is substantially no inductor current when the voltage of the input capacitor is at the minimum voltage $Vp_2$, then, the first driving switch and the second driving switch are turned off, which causes the voltage of the input capacitor to increase from the minimum voltage $Vp_2$ to a second steady voltage,
wherein the first and second equivalent capacitors are configured such that:
(1) during the discharging procedure, while the voltage of the input capacitor is changed from the minimum voltage $Vp_2$ to the second steady voltage, a third amount of charges discharged from the input capacitor is equal to Q3, whereas while the voltage of the input capacitor is changed from the minimum voltage $Vp_2$ to a second set voltage VL a fourth amount of charges discharged from the input capacitor is equal to Q4, wherein Q4 is greater than or equal to Q3, and
(2) the second steady voltage is lower than the second set voltage VL, and the second set voltage VL is lower than a minimum threshold Vmin of the gate terminal of the power switch.

23. The driving circuit according to claim 22, wherein a first terminal of the first driving switch is electrically connected with an input power source, a second terminal of the first driving switch is electrically connected with a first terminal of the second driving switch and a first terminal of the inductor, a second terminal of the second driving switch is connected with a ground terminal, a second terminal of the inductor is electrically connected with a first terminal of the resistor, and a second terminal of the resistor is electrically connected with the input capacitor.

24. The driving circuit according to claim 23, wherein the first equivalent capacitor is formed corresponding to the input capacitor and the second equivalent capacitor is formed corresponding to the first parasitic capacitor and the second parasitic capacitor, such that:

$$Q3=(Coss31+Coss32)\times(Vcc-Vo_2)$$

$$Q4=Ciss\times(Vp_2-VL)$$

where Coss31 is a capacitance of the first parasitic capacitor, Coss32 is a capacitance of the second parasitic capacitor, Ciss is a capacitance of the input capacitor, $Vo_2$ is the second steady voltage and Vcc is a voltage of the input power source.

25. The driving circuit according to claim 23, wherein the driving circuit further comprises a first clamping circuit and a second clamping circuit, the first clamping circuit comprises a third parasitic capacitor, and the second clamping circuit comprises a fourth parasitic capacitor, wherein a first terminal of the first clamping circuit is connected with the first terminal of the first driving switch and the input power source, a second terminal of the first clamping circuit is connected with the second terminal of the inductor, a first terminal of the second clamping circuit and the first terminal of the resistor, and a second terminal of the second clamping circuit is connected with the ground terminal, wherein when the voltage of the input capacitor is higher than an over-voltage value, the voltage of the input capacitor is clamped to the over-voltage value by the first clamping circuit, wherein when the voltage of the input capacitor is lower than an under-voltage value, the voltage of the input capacitor is clamped to the under-voltage value by the second clamping circuit.

26. The driving circuit according to claim 25, wherein the first equivalent capacitor is formed corresponding to the input capacitor, the third parasitic capacitor and the fourth parasitic capacitor, the second equivalent capacitor is formed corresponding to the first parasitic capacitor and the second parasitic capacitor, such that:

$$Q3=(Coss31+Coss32)\times(Vcc-Vo_2)$$

$$Q4=(Ciss+Coss34+Coss35)\times(Vp2-VL)$$

where Coss31 is a capacitance of the first parasitic capacitor, Coss32 is a capacitance of the second parasitic capacitor, Ciss is a capacitance of the input capacitor, Coss35 is a capacitance of the third parasitic capacitor of the first clamping circuit, $Vo_2$ is the second steady voltage, Vcc is a voltage of the input power source, and Coss34 is a capacitance of the fourth parasitic capacitor of the second clamping circuit.

27. The driving circuit according to claim 22, wherein a first terminal of the inductor is electrically connected with an input power source, a second terminal of the inductor is electrically connected with a first terminal of the first driving switch and a first terminal of the second driving switch, a second terminal of the second driving switch is electrically connected with a first terminal of the resistor, and a second terminal of the resistor is electrically connected with the input capacitor, and a second terminal of the first driving switch is electrically connected with a ground terminal.

28. The driving circuit according to claim 27, wherein the first equivalent capacitor is formed corresponding to the input capacitor and the second equivalent capacitor is formed corresponding to the second parasitic capacitor, such that:

$$Q3=Coss42\times(Vp_2+Vcc-Vo_2)$$

$$Q4=Ciss\times(Vp_2-VL)$$

where Coss42 is a capacitance of the second parasitic capacitor of the second driving switch, Ciss is a capacitance of the input capacitor, $Vo_2$ is the second steady voltage, and Vcc is a voltage of the input power source.

29. The driving circuit according to claim 27, wherein the driving circuit further comprises a third driving switch and a DC clamping power source, and the third driving switch has a third parasitic capacitor, wherein a first terminal of the third driving switch is electrically connected with the second terminal of the second driving switch and the first terminal of the resistor, and the DC clamping power source is connected between a second terminal of the third driving switch and the ground terminal, wherein when the third driving switch is turned on, the input capacitor is charged by the DC clamping power source, wherein when the third driving switch is turned off, the first driving switch and the second driving switch are selectively turned on or turned off to control the discharging procedure of the input capacitor.

30. The driving circuit according to claim 29, wherein the first equivalent capacitor is formed corresponding to the input capacitor and the third parasitic capacitor, the second parasitic capacitor is formed corresponding to the second parasitic capacitor, such that:

$$Q3=Coss42\times(Vp_2+Vcc-Vo_2)$$

$$Q4=(Ciss+Coss43)\times(Vp2-VL)$$

where Coss42 is a capacitance of the second parasitic capacitor of the second driving switch, Ciss is a capacitance of the input capacitor, Coss43 is a capacitance of the third parasitic capacitor, $Vo_2$ is the second steady voltage, and Vcc is a voltage of the input power source.

31. The driving circuit according to claim 27, wherein the driving circuit further comprises a first clamping circuit and a DC clamping power source, and the first clamping circuit has a third parasitic capacitor, wherein a first terminal of the first clamping circuit is electrically connected with the second terminal of the second driving switch and the first terminal of the resistor, and the DC clamping power source is connected between a second terminal of the first clamping circuit and the ground terminal, wherein when the voltage of the input capacitor is higher than a voltage of the DC clamping power source, the voltage of the input capacitor is clamped to the voltage of the DC clamping power source by the first clamping circuit.

32. The driving circuit according to claim 31, wherein the first equivalent capacitor is formed corresponding to the input capacitor and the third parasitic capacitor, the second parasitic capacitor is formed corresponding to the second parasitic capacitor, such that:

$$Q3=Coss42\times(Vp_2+Vcc-Vo_2)$$

$$Q4=(Ciss+Coss43)\times(Vp2-VL)$$

where Coss42 is a capacitance of the second parasitic capacitor of the second driving switch, Ciss is a capacitance of the input capacitor, Coss43 is a capacitance of the third parasitic capacitor, $Vo_2$ is the second steady voltage, and Vcc is a voltage of the input power source.

33. The driving circuit according to claim 22, further comprising a third driving switch and a fourth driving switch, wherein a first terminal of the first driving switch is electrically connected with an input power source, a second terminal of the first driving switch is electrically connected with a first terminal of the second driving switch and a first terminal of the inductor, a second terminal of the second driving switch is connected with a ground terminal, a first terminal of the fourth driving switch is electrically connected with a first terminal of the resistor, a second terminal of the fourth driving switch is electrically connected with a second terminal of the inductor and a first terminal of the third driving switch, a second terminal of the third driving switch is connected with the ground terminal, and a second terminal of the resistor is electrically connected with the input capacitor, wherein the driving circuit selectively turns on or turns off the first driving switch, the second driving switch, third driving switch and the fourth driving switch to control the discharging procedure of the input capacitor.

34. The driving circuit according to claim 33, wherein the first equivalent capacitor is formed corresponding to the input capacitor, a third parasitic capacitor of the third driving switch and a fourth parasitic capacitor of the fourth driving switch, the second equivalent capacitor is formed corresponding to the first parasitic capacitor and the second parasitic capacitor, such that:

$$Q3=(Coss51+Coss52)\times[Vcc-(Vo_2-Vp_2)\times(Ciss/Coss54)]$$

$$Q4=(Coss53+Coss54)\times(VL-Vp_2)\times(Ciss/Coss54)+Coss53\times(VL-Vp_2)$$

where $Vo_2$ is the second steady voltage, Coss51 is a capacitance of the first parasitic capacitor of the first driving switch, Coss52 is a capacitance of the second parasitic capacitor of the second driving switch, Ciss is a capacitance of the input capacitor, Coss53 is a capacitance of the third parasitic capacitor of the third driving switch, and Coss54 is a capacitance of the fourth parasitic capacitor of the fourth driving switch.

35. The driving circuit according to claim 22, wherein the resistor has a resistance causing the second steady voltage to be lower than 0.5×(Vp2+Vmin).

36. The driving circuit according to claim 22, wherein, during the discharging procedure, the first driving switch is turned off while the second driving switch is turned on and then the first driving switch is turned on while the second driving switch is turned off to thereby cause the voltage of the input capacitor to decrease to the minimum voltage $Vp_2$.

\* \* \* \* \*